(12) United States Patent
Choi et al.

(10) Patent No.: US 10,409,325 B2
(45) Date of Patent: Sep. 10, 2019

(54) PANEL VIBRATION TYPE SOUND GENERATING ACTUATOR AND DOUBLE-FACED DISPLAY DEVICE INCLUDING SAME

(71) Applicant: LG DISPLAY CO., LTD., Seoul (KR)

(72) Inventors: YeongRak Choi, Paju-si (KR); Sungtae Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/340,709

(22) Filed: Nov. 1, 2016

(65) Prior Publication Data

US 2017/0289694 A1   Oct. 5, 2017

(30) Foreign Application Priority Data

Apr. 4, 2016  (KR) .................. 10-2016-0040885

(51) Int. Cl.
*H04R 9/04*    (2006.01)
*H04R 23/02*   (2006.01)
(Continued)

(52) U.S. Cl.
CPC .......... *G06F 1/1605* (2013.01); *G02F 1/1333* (2013.01); *G06F 1/1616* (2013.01);
(Continued)

(58) Field of Classification Search
CPC .......... H04R 9/04; H04R 9/06; G06F 1/1605; G06F 1/1647; G06F 3/0412; G06F 3/016;
(Continued)

(56) References Cited

U.S. PATENT DOCUMENTS

| | | | |
|---|---|---|---|
| 4,675,907 A | * | 6/1987 | Itagaki .................. H04R 9/066 381/152 |
| 4,891,842 A | | 1/1990 | Green |

(Continued)

FOREIGN PATENT DOCUMENTS

| CN | 1547416 A | 11/2004 |
|---|---|---|
| CN | 1930910 A | 3/2007 |

(Continued)

OTHER PUBLICATIONS

Hermida, PC screen turs into speaker, BBC News Technology, 2003.*

(Continued)

*Primary Examiner* — Davetta W Goins
*Assistant Examiner* — Kuassi A Ganmavo
(74) *Attorney, Agent, or Firm* — Morgan, Lewis & Bockius LLP

(57) ABSTRACT

The present embodiment relates to a double-faced display device generating sound by directly vibrating a display panel and includes: a first display panel and a second display panel disposed at the front and rear surface thereof, respectively; a single sound generating actuator connected to the first display panel and the second display panel to simultaneously vibrate the first display panel and the second display panel and thus generate sound; and a support part configured to support the sound generating actuator, the first display panel, and the second display panel. The present embodiment does not require a separate speaker and thus can achieve a thin or slim display device, and can improve the localization or the quality of sound output in opposite directions in the double-faced display device.

18 Claims, 24 Drawing Sheets

(51) Int. Cl.

| | | |
|---|---|---|
| *G06F 1/16* | (2006.01) | |
| *H04R 9/06* | (2006.01) | |
| *G02F 1/1333* | (2006.01) | |
| *H04R 7/04* | (2006.01) | |
| *H03H 9/00* | (2006.01) | |
| *H04R 1/02* | (2006.01) | |
| *H04R 1/26* | (2006.01) | |
| *H04R 1/28* | (2006.01) | |
| *H04R 5/02* | (2006.01) | |
| *H04R 9/02* | (2006.01) | |
| *H04R 11/02* | (2006.01) | |

(52) U.S. Cl.
CPC .......... *G06F 1/1626* (2013.01); *G06F 1/1647* (2013.01); *G06F 1/1688* (2013.01); *H04R 7/045* (2013.01); *G02F 1/133308* (2013.01); *H03H 9/00* (2013.01); *H04R 1/025* (2013.01); *H04R 1/028* (2013.01); *H04R 1/26* (2013.01); *H04R 1/288* (2013.01); *H04R 5/02* (2013.01); *H04R 9/025* (2013.01); *H04R 11/02* (2013.01); *H04R 2440/05* (2013.01); *H04R 2440/07* (2013.01); *H04R 2499/11* (2013.01); *H04R 2499/15* (2013.01)

(58) Field of Classification Search
CPC ......... Y10T 29/42; H03H 9/00; G02F 1/1339; G02F 1/13394; G02F 1/13336
See application file for complete search history.

(56) References Cited

U.S. PATENT DOCUMENTS

| | | | |
|---|---|---|---|
| 5,025,474 A * | 6/1991 | Tanaka | G03B 21/565 |
| | | | 181/148 |
| 5,535,028 A * | 7/1996 | Bae | G02F 1/1362 |
| | | | 349/145 |
| 5,796,854 A | 8/1998 | Markow | |
| 5,856,819 A * | 1/1999 | Vossler | G09F 9/35 |
| | | | 345/102 |
| 6,137,890 A | 10/2000 | Markow | |
| 6,208,237 B1 * | 3/2001 | Saiki | H04M 1/03 |
| | | | 340/388.1 |
| 6,238,755 B1 * | 5/2001 | Harvey | E06B 3/66328 |
| | | | 156/109 |
| 6,342,831 B1 | 1/2002 | Azima | |
| 6,443,586 B1 | 9/2002 | Azima et al. | |
| 6,610,237 B2 | 8/2003 | Azima et al. | |
| 6,618,487 B1 * | 9/2003 | Azima | H04R 1/24 |
| | | | 381/152 |
| 6,677,384 B1 | 1/2004 | Ikemoto et al. | |
| 6,678,384 B2 * | 1/2004 | Kowaki | H04R 1/2896 |
| | | | 181/144 |
| 6,751,329 B2 | 6/2004 | Colloms et al. | |
| 6,795,561 B1 | 9/2004 | Bank | |
| 6,819,309 B1 * | 11/2004 | Kishi | G02F 1/1333 |
| | | | 345/107 |
| 6,826,285 B2 | 11/2004 | Azima | |
| 6,871,149 B2 | 3/2005 | Sullivan et al. | |
| 6,911,901 B2 | 6/2005 | Bown | |
| 6,922,642 B2 | 7/2005 | Sullivan | |
| 6,937,124 B1 | 8/2005 | Nakamura et al. | |
| 6,956,957 B1 | 10/2005 | Azima et al. | |
| 6,985,596 B2 | 1/2006 | Bank et al. | |
| 7,020,302 B2 | 3/2006 | Konishi et al. | |
| 7,050,600 B2 | 5/2006 | Saiki et al. | |
| 7,120,264 B2 | 10/2006 | Saiki et al. | |
| 7,157,649 B2 | 1/2007 | Hill | |
| 7,158,651 B2 * | 1/2007 | Bachmann | H04R 11/02 |
| | | | 381/191 |
| 7,174,025 B2 | 2/2007 | Azima et al. | |
| 7,184,898 B2 | 2/2007 | Sullivan et al. | |
| 7,215,329 B2 | 5/2007 | Yoshikawa et al. | |
| 7,305,248 B2 | 12/2007 | Mori | |
| 7,372,110 B2 | 5/2008 | Hatano | |
| 7,376,523 B2 | 5/2008 | Sullivan et al. | |
| 7,382,890 B2 | 6/2008 | Saiki et al. | |
| 7,536,211 B2 | 5/2009 | Saiki et al. | |
| 7,545,459 B2 | 6/2009 | Fujiwara et al. | |
| 7,564,984 B2 | 7/2009 | Bank et al. | |
| 7,570,771 B2 | 8/2009 | Whitwell et al. | |
| 7,593,159 B2 | 9/2009 | Yokoyama et al. | |
| 7,657,042 B2 | 2/2010 | Miyata | |
| 7,764,803 B2 | 7/2010 | Kang | |
| 7,769,191 B2 | 8/2010 | Lee et al. | |
| 7,800,702 B2 | 9/2010 | Tsuboi et al. | |
| 7,903,091 B2 | 3/2011 | Lee et al. | |
| 8,174,495 B2 | 5/2012 | Takashima et al. | |
| 8,174,511 B2 | 5/2012 | Takenaka et al. | |
| 8,180,074 B2 | 5/2012 | Ko et al. | |
| 8,194,894 B2 | 6/2012 | Burton et al. | |
| 8,274,480 B2 | 9/2012 | Sullivan | |
| 8,736,558 B2 | 5/2014 | East et al. | |
| 8,830,211 B2 | 9/2014 | Hill | |
| 8,879,766 B1 | 11/2014 | Zhang | |
| 8,917,168 B2 | 12/2014 | Kono et al. | |
| 8,934,228 B2 | 1/2015 | Franklin et al. | |
| 9,001,060 B2 | 4/2015 | Harris | |
| 9,030,447 B2 | 5/2015 | Hsu | |
| 9,035,918 B2 | 5/2015 | Harris et al. | |
| 9,041,662 B2 | 5/2015 | Harris | |
| 9,046,949 B2 | 6/2015 | Adachi et al. | |
| 9,107,006 B2 | 8/2015 | Wang et al. | |
| 9,122,011 B2 | 9/2015 | Oh et al. | |
| 9,131,301 B2 | 9/2015 | Tsai et al. | |
| 9,137,592 B2 | 9/2015 | Yliaho et al. | |
| 9,148,716 B2 | 9/2015 | Liu et al. | |
| 9,173,014 B2 | 10/2015 | Park | |
| 9,191,749 B2 | 11/2015 | Nabata et al. | |
| 9,197,966 B2 | 11/2015 | Umehara et al. | |
| 9,204,223 B2 | 12/2015 | Nabata et al. | |
| 9,285,882 B2 | 3/2016 | Wang et al. | |
| 9,288,564 B2 | 3/2016 | Faerstain et al. | |
| 9,300,770 B2 | 3/2016 | Nabata et al. | |
| 9,317,063 B2 | 4/2016 | Kwon et al. | |
| 9,332,098 B2 | 5/2016 | Horii | |
| 9,350,832 B2 | 5/2016 | Horii | |
| 9,357,280 B2 | 5/2016 | Mellow et al. | |
| 9,363,591 B2 | 6/2016 | Ozasa et al. | |
| 9,363,607 B2 | 6/2016 | Ando | |
| 9,380,366 B2 | 6/2016 | Kang et al. | |
| 9,389,688 B2 | 7/2016 | Tossavainen et al. | |
| 9,398,358 B2 | 7/2016 | Louh | |
| 9,436,320 B2 | 9/2016 | Kang et al. | |
| 9,544,671 B2 | 1/2017 | Shi et al. | |
| 9,609,438 B2 | 3/2017 | Kim et al. | |
| 9,654,863 B2 | 5/2017 | Crosby et al. | |
| 9,818,805 B2 | 11/2017 | Choi et al. | |
| 10,129,646 B2 | 11/2018 | Choi et al. | |
| 2001/0040976 A1 * | 11/2001 | Buos | H04R 7/045 |
| | | | 381/431 |
| 2001/0043714 A1 * | 11/2001 | Asada | H04R 5/02 |
| | | | 381/399 |
| 2002/0018574 A1 | 2/2002 | Okuno et al. | |
| 2002/0064290 A1 | 5/2002 | Reynaga et al. | |
| 2002/0141607 A1 | 10/2002 | Azima et al. | |
| 2003/0233794 A1 * | 12/2003 | Pylkki | E06B 7/28 |
| | | | 52/173.1 |
| 2004/0008859 A1 * | 1/2004 | Zhao | H04R 9/063 |
| | | | 381/401 |
| 2004/0184622 A1 * | 9/2004 | Ohashi | H04R 9/046 |
| | | | 381/111 |
| 2005/0129258 A1 | 6/2005 | Fincham | |
| 2005/0129265 A1 * | 6/2005 | Nakajima | H04R 9/022 |
| | | | 381/412 |
| 2006/0018503 A1 | 1/2006 | Endo | |
| 2006/0078153 A1 | 4/2006 | Sato | |
| 2006/0120542 A1 | 6/2006 | Lee | |
| 2006/0126885 A1 * | 6/2006 | Combest | H04R 9/063 |
| | | | 381/401 |
| 2006/0140439 A1 | 6/2006 | Nakagawa | |

(56) References Cited

U.S. PATENT DOCUMENTS

| | | | |
|---|---|---|---|
| 2006/0187140 A1* | 8/2006 | Brask | G06F 1/1601 |
| | | | 345/1.1 |
| 2007/0019134 A1 | 1/2007 | Park et al. | |
| 2007/0036388 A1 | 2/2007 | Lee et al. | |
| 2007/0187172 A1 | 8/2007 | Kaneda et al. | |
| 2007/0206822 A1 | 9/2007 | Whitwell | |
| 2007/0290609 A1* | 12/2007 | Ishii | H01L 51/524 |
| | | | 313/504 |
| 2009/0034174 A1 | 2/2009 | Ko et al. | |
| 2009/0034759 A1 | 2/2009 | Ko et al. | |
| 2009/0097692 A1 | 4/2009 | Sakamoto | |
| 2009/0141926 A1 | 6/2009 | Clair et al. | |
| 2009/0247237 A1* | 10/2009 | Mittleman | H04M 1/026 |
| | | | 455/567 |
| 2009/0267891 A1 | 10/2009 | Ali | |
| 2011/0248935 A1 | 10/2011 | Mellow et al. | |
| 2012/0034541 A1 | 2/2012 | Muraoka et al. | |
| 2012/0242592 A1 | 9/2012 | Rothkopf et al. | |
| 2012/0243719 A1 | 9/2012 | Franklin et al. | |
| 2012/0274570 A1* | 11/2012 | Kim | H04M 1/0237 |
| | | | 345/168 |
| 2013/0077810 A1 | 3/2013 | Mellow et al. | |
| 2013/0089231 A1 | 4/2013 | Wilk et al. | |
| 2013/0106868 A1 | 5/2013 | Shenoy | |
| 2013/0250169 A1 | 9/2013 | Kim | |
| 2014/0029777 A1 | 1/2014 | Jang | |
| 2014/0049522 A1 | 2/2014 | Mathew et al. | |
| 2014/0145836 A1 | 5/2014 | Tossavainen et al. | |
| 2014/0146093 A1 | 5/2014 | Sako et al. | |
| 2014/0197380 A1* | 7/2014 | Sung | H01L 27/3241 |
| | | | 257/40 |
| 2014/0241558 A1* | 8/2014 | Yliaho | H04R 5/02 |
| | | | 381/333 |
| 2014/0241564 A1 | 8/2014 | Kang et al. | |
| 2014/0326402 A1 | 11/2014 | Lee et al. | |
| 2014/0334078 A1 | 11/2014 | Lee et al. | |
| 2015/0010187 A1 | 1/2015 | Lee et al. | |
| 2015/0016658 A1 | 1/2015 | Lee | |
| 2015/0062101 A1 | 3/2015 | Kim et al. | |
| 2015/0078604 A1 | 3/2015 | Seo et al. | |
| 2015/0119834 A1 | 4/2015 | Locke et al. | |
| 2015/0138157 A1 | 5/2015 | Harris et al. | |
| 2015/0195630 A1 | 7/2015 | Yliaho et al. | |
| 2015/0341714 A1 | 11/2015 | Ahn et al. | |
| 2015/0350775 A1 | 12/2015 | Behles et al. | |
| 2016/0011442 A1 | 1/2016 | Lee et al. | |
| 2016/0050472 A1 | 2/2016 | Lee et al. | |
| 2016/0165327 A1 | 6/2016 | Crosby et al. | |
| 2016/0212513 A1 | 7/2016 | Honda et al. | |
| 2016/0261966 A1 | 9/2016 | Won | |
| 2016/0345102 A1 | 11/2016 | Tagami et al. | |
| 2017/0070811 A1 | 3/2017 | Mihelich et al. | |
| 2017/0280216 A1 | 9/2017 | Lee et al. | |

FOREIGN PATENT DOCUMENTS

| | | |
|---|---|---|
| CN | 101093852 A | 12/2007 |
| CN | 102946577 A | 2/2013 |
| CN | 105096778 A | 11/2015 |
| CN | 107561753 A | 1/2018 |
| CN | 206993387 U | 2/2018 |
| EP | 0916801 A2 | 5/1999 |
| EP | 1 507 438 A2 | 2/2005 |
| EP | 1881731 A1 | 1/2008 |
| EP | 2947857 A2 | 11/2015 |
| JP | 55-25284 A | 2/1980 |
| JP | H02001987 U | 1/1990 |
| JP | H03132296 A | 6/1991 |
| JP | 2696801 B2 | 1/1998 |
| JP | H11-44891 A | 2/1999 |
| JP | 2001-61194 A | 3/2001 |
| JP | 2002-511681 A | 4/2002 |
| JP | 2002-264646 A | 9/2002 |
| JP | 2003-211087 A | 7/2003 |
| JP | 2003-211087 A1 * | 7/2003 |
| JP | 2003211087 A * | 7/2003 |
| JP | 3578244 B2 | 10/2004 |
| JP | 2004-343362 A | 12/2004 |
| JP | 2005-175553 A | 6/2005 |
| JP | 2005-244804 A | 9/2005 |
| JP | 2006-138149 A | 6/2006 |
| JP | 2006-186590 A | 7/2006 |
| JP | 2006279284 A | 10/2006 |
| JP | 2006-319626 A | 11/2006 |
| JP | 2006-325079 A | 11/2006 |
| JP | 3896675 B2 | 3/2007 |
| JP | 2007-267302 A | 10/2007 |
| JP | 2007-528648 A | 10/2007 |
| JP | 2007-300578 A | 11/2007 |
| JP | 2009-100223 A | 5/2009 |
| JP | 2009100223 A | 5/2009 |
| JP | 2009200334 A | 5/2009 |
| JP | 2009214060 A | 9/2009 |
| JP | 2009-302924 A | 12/2009 |
| JP | 2010-027845 A | 2/2010 |
| JP | 2010-081142 A | 4/2010 |
| JP | 4449605 B2 | 4/2010 |
| JP | 2011123696 A | 6/2011 |
| JP | 2012-129247 A | 7/2012 |
| JP | 2012-198407 A | 10/2012 |
| JP | 5060443 B2 | 10/2012 |
| JP | 2013-044912 A | 3/2013 |
| JP | 2013-102360 A | 5/2013 |
| JP | 2014-509028 A | 4/2014 |
| JP | 2014-220237 A | 11/2014 |
| JP | 2014-220802 A | 11/2014 |
| JP | 2015-219528 A | 12/2015 |
| KR | 10-2008-0002228 A | 1/2008 |
| KR | 2008-0063698 A | 7/2008 |
| KR | 10-1026987 B1 | 4/2011 |
| KR | 10-1061519 B1 | 9/2011 |
| KR | 10-1404119 B1 | 6/2014 |
| KR | 101410393 B2 | 6/2014 |
| KR | 2015-0005089 A | 1/2015 |
| KR | 10-2015-0031641 A | 3/2015 |
| KR | 10-1499514 B1 | 3/2015 |
| KR | 10-2015-0131428 A | 11/2015 |
| KR | 2015-133918 A | 12/2015 |
| KR | 10-2017-0135673 A | 12/2017 |
| TW | 200706049 A | 2/2007 |
| TW | M451766 U | 4/2013 |
| TW | 201319783 A | 5/2013 |
| TW | 201503710 A | 1/2015 |
| TW | 201545559 A | 12/2015 |
| WO | 99/52322 A1 | 10/1999 |
| WO | 2005089014 A1 | 9/2005 |
| WO | 2009-017280 A1 | 2/2009 |
| WO | 2012/129247 A2 | 9/2012 |
| WO | 2015-046288 A1 | 4/2015 |
| WO | 2016/002230 A1 | 1/2016 |

OTHER PUBLICATIONS

Shim, Samsung claims double sided LCD, EDN, Jan. 2007.*
Office Action dated Sep. 26, 2017 from the Japanese Patent Office in related Japanese application No. 2016-190615.
Office Action dated Oct. 3, 2017 from the Japanese Patent Office in related Japanese application No. 2016-235794.
Communication dated Sep. 19, 2017 from the European Patent Office in related European application No. 16181185.6.
Communication dated Sep. 5, 2017 from the European Patent Office in related European application No. 16181191.4.
Communication dated Jun. 30, 2017 from the European Patent Office in related European application No. 16181195.5.
USPTO Office Action dated Sep. 8, 2017 in related U.S. Appl. No. 15/374,566.
USPTO Office Action dated Oct. 26, 2017 in related U.S. Appl. No. 15/471,458.
USPTO Office Action dated Nov. 9, 2017 in related U.S. Appl. No. 15/471,173.
USPTO Office Action dated Aug. 10, 2017 in related U.S. Appl. No. 15/340,709.

(56) References Cited

OTHER PUBLICATIONS

USPTO Office Action dated Oct. 13, 2017 in related U.S. Appl. No. 15/471,184.
Hermida, Alfred, "PC Screen Turns Into Speaker," BBC News, Technology, Mar. 31, 2003, pp. 1-2.
Taiwanese Office Action dated May 15, 2018, issued in Taiwanese Application No. 106122586.
Japanese Office Action dated Jul. 3, 2018, issued in Japanese Application No. 2016-235794.
Japanese Office Action dated Jun. 5, 2018, issued in Japanese Application No. 2017-131154.
Office Action dated May 31, 2017, from the Taiwanese Patent Office in Application No. 106121605.
U.S. Appl. No. 15/374,566, filed Dec. 9, 2016.
U.S. Appl. No. 15/388,939, filed Dec. 22, 2016.
U.S. Appl. No. 15/340,709, filed Nov. 1, 2016.
U.S. Appl. No. 15/471,458, filed Mar. 28, 2017.
U.S. Appl. No. 15/471,431, filed Mar. 28, 2017.
U.S. Appl. No. 15/471,184, filed Mar. 28, 2017.
U.S. Appl. No. 15/471,155, filed Mar. 28, 2017.
U.S. Appl. No. 15/471,164, filed Mar. 28, 2017.
U.S. Appl. No. 15/471,173, filed Mar. 28, 2017.
Extended European Search Report issued in European Application No. 17183078.9 dated Jan. 16, 2018.
Extended European Search Report issued in European Application No. 17184428.5 dated Jan. 23, 2018.
Extended European Search Report issued in European Application No. 17184429.3 dated Jan. 26, 2018.
Japanese Office Action issued in Japanese Application No. 2016-216426 dated Nov. 24, 2017.
Taiwanese Office Action issued in Taiwanese Application No. 10720014270 dated Jan. 10, 2018.
Taiwanese Office Action issued in Taiwanese Application No. 10621325350 dated Jan. 3, 2018.
Office Action dated Mar. 27, 2017, from the Korean Patent Office in related Application No. 10-2016-0146951. Note: KR 10-2015-0133918, JP 2009-100223, and JP 2007-300578 cited therein are already of record.
Chinese Office Action dated Mar. 20, 2019, issued in Chinese Patent Application No. 2017-10599021.3.
Non-final Office Action from the U.S. Patent and Trademark Office issued in U.S. Appl. No. 16/038,075 dated Jan. 18, 2019.
Japanese Office Action dated Apr. 9, 2019, issued in Japanese Patent Application No. 2017-124022.
Office Action issued in Chinese Patent Application No. 201610824741.0 dated Jun. 4, 2019.

* cited by examiner

PANEL VIBRATION TYPE SOUND GENERATING ACTUATOR AND DOUBLE-FACED DISPLAY DEVICE INCLUDING SAME

CROSS REFERENCE TO RELATED APPLICATION

This application claims priority from Korean Patent Application No. 10-2016-0040885, filed on Apr. 4, 2016, which is hereby incorporated by reference for all purposes as if fully set forth herein.

BACKGROUND OF THE DISCLOSURE

1. Field of the Disclosure

The present disclosure relates to a panel vibration type sound generating actuator and a double-faced display device including the same and, more specifically, to an actuator, which generates sound by directly vibrating a display panel, and a double-faced display device including the same.

2. Description of the Prior Art

With the development of various portable electronic devices, such as mobile communication terminals and notebook computers, there is an increased interest in developing flat panel display devices applicable thereto.

Such flat panel display devices include a Liquid Crystal Display Device, a Plasma Display Panel, a Field Emission Display Device, a Light Emitting Diode Display Device, and an Organic Light Emitting Diode Display Device.

Among these display devices, the Liquid Crystal Display (LCD) device includes: an array substrate including a thin film transistor; an upper substrate including a color filter and/or a black matrix; and a liquid crystal material layer formed therebetween, wherein an alignment state of the liquid crystal layer is controlled according to an electric field applied between opposite electrodes of a pixel area, and thereby the transmittance of light is adjusted to display an image.

In a display panel of such a liquid crystal display device, an Active Area (AA) configured to provide an image to a user and a Non-active Area (NA), which is a peripheral area of the Active Area (AA), are defined. Conventionally, a display panel is manufactured by attaching a first substrate, which is an array substrate having a thin film transistor formed therein to define a pixel area, and a second substrate, which is an upper substrate having a black matrix and/or color filter layer formed thereon, to each other.

The array substrate or first substrate, on which a thin film transistor is formed, includes a plurality of gate lines GS extending in a first direction and a plurality of data lines DL extending in a second direction perpendicular to the first direction, and one pixel area P is defined by each gate line and each data line. One or more thin film transistors are formed in one pixel area P, and gate and source electrodes of each thin film transistor may be connected to a gate line and a data line, respectively.

Among these display devices, the liquid crystal display device does not have its own light-emitting element and thus needs a separate light source. Therefore, the liquid crystal display device has a back-light unit having a light source, such as an LED, which is arranged at the rear surface thereof and irradiates a light toward a front surface of the liquid crystal panel thereof, thereby implementing a recognizable image.

On the other hand, the organic light emitting display device, which has been in the spotlight recently, has a fast response rate, a high light emitting efficiency, a high luminance and a wide viewing angle compared to an LCD device, because an Organic Light Emitting Diode (OLED) emits light by itself, i.e., a separate light source is not required.

In such an organic light emitting display device, sub-pixels including organic light emitting diodes are arranged in a matrix form and brightness of selected sub-pixels is controlled by a scan signal which depends on gradation of the data. Further, the organic light emitting display device is a self light-emitting device, and thus has lower power consumption, a high response speed, a high light-emitting efficiency, high luminance, and a wide viewing angle.

Meanwhile, a set apparatus or finished product including such a display device as described above may include, for example, a television (TV), a computer monitor, or an advertising panel.

Such a display device or set apparatus includes a sound output device, such as a speaker, for generating and outputting sound relating to an image.

Conventionally, a company that manufactures a display device, such as a liquid crystal display device or an organic light emitting diode display device, manufactures only a display panel or display device, while another company that manufactures a sound output device, such as a speaker, assembles the sound output device and the manufactured display device to complete a set apparatus capable of outputting both image and sound.

FIG. 1 is a schematic plan view of a speaker included in a conventional display device. As shown in FIG. 1, the conventional display device 1 includes a speaker 2 disposed at a rear or lower part of a display panel thereof.

In this structure, the sound generated by the speaker 2 does not progress toward a viewer, who is viewing an image from the front side of the display device 1, but progresses toward the rear side or the underside of the display panel rather than the display panel on which the image is being displayed. Therefore, the sound may disturb the viewer's immersive experience.

Further, when the sound generated from the speaker 2 progresses toward the rear side or underside of the display panel, the sound quality may be degraded due to an interference with sound reflected by a wall or floor.

Also, the sound generated by a speaker included in a conventional display device is not oriented toward a viewer of the display device and may thus undergo diffraction, which further reduces sound localization. Moreover, in configuring a set apparatus, such as a TV, a speaker may occupy a predetermined space, which imposes a restriction on the design and spatial arrangement of the set apparatus.

Therefore, there has been an increasing interest in developing technology which can improve the quality of sound output from a display device and prevent the viewer's immersive experience from being disturbed.

A general flat display device outputs an image through only one side thereof and is unable to output an image through the other side, since the other side is supported by a cover bottom or back cover.

Recently, display devices having special functions for commercial purposes are being developed, one of which is a double-faced display device capable of outputting an image through both sides thereof.)

For example, a double-faced display device may have one side disposed indoors and the other side disposed outdoors, which display the same image or different images thereon, so as to enable viewing of the image or images both indoors and outdoors.

The double-faced display device as described above is required to output sound in opposite directions. To this end, the double-faced display device generally includes two or more speakers as shown in FIG. 1 arranged in opposite directions.

When two or more speakers are arranged in opposite directions to output sound, the sounds output in opposite directions may overlap or interfere with each other to degrade the sound transfer characteristic.

Therefore, it is necessary to develop a separate sound generating apparatus, which occupies a small space and has an excellent sound generation characteristic, so that it can be used for a double-faced display device.

SUMMARY OF THE DISCLOSURE

The present disclosure has been made to overcome the above-mentioned problems of the prior arts and, in one aspect, provides a panel vibration type sound generating double-faced display device and a sound generating actuator used therein, which can generate sound by directly vibrating two display panels which provide the double-faced display device.

In another aspect, the present disclosure provides a single sound generating actuator, which is fixed to a support structure of a double-faced display device to directly vibrate two display panels arranged at opposite sides thereof, and the double-faced display device including the same. The support structure may also be termed a support part or support element.

In another aspect, the present disclosure provides a single sound generating actuator, which is fixed to a support structure of a double-faced display device to directly vibrate two display panels arranged at opposite sides thereof, and includes a single bobbin having an opening part allowing movement thereof in opposite directions, a plate having a through-hole formed therethrough to allow the bobbin to move in opposite directions, and at least one magnet, thereby minimizing the space occupied by the sound generating apparatus of the double-faced display device. A coil may be wound around the outside of the bobbin.

In still another aspect, the present disclosure provides a double-faced display device, which includes a single sound generating actuator configured to simultaneously vibrate opposite display panels of the double-faced display device to generate sound, and a weight member additionally disposed on one of the opposite display panels, thereby minimizing the reduction in sound pressure due to the phase difference between sound waves generated in opposite directions.

In view of the above aspects, disclosed herein is a double-faced display device comprising: a first display panel and a second display panel disposed at a front surface and a rear surface thereof, respectively; a single sound generating actuator in contact with the first display panel and the second display panel to simultaneously vibrate the first display panel and the second display panel to generate sound; and a support part configured to support the sound generating actuator, the first display panel, and the second display panel.

In this embodiment, the sound generating actuator may include a plate having at least one through-hole, a bobbin having at least one opening part, a magnet disposed on the plate, a center pole disposed at a center of the plate, and a coil wound around an outside of a portion of the bobbin, wherein the bobbin has a connection part, which interconnects an upper part and a lower part of the bobbin, and the connection part is inserted through the through-hole of the plate when the bobbin is assembled with the plate. The plate may be a lower plate, for example.

The double-faced display device may further comprise adhesive members disposed on opposite distal ends of the bobbin to attach the opposite distal ends of the bobbin with the first display panel and the second display panel, respectively.

A cover bottom of the support part may have a support hole formed therethrough, the lower plate of the sound generating actuator may be inserted through and fixed in the support hole, and the sound generating actuator may further include adhesive members disposed on opposite distal ends of the bobbin to attach the distal ends of the bobbin to the first display panel and the second display panel.

The double-faced display device may further include a baffle part, which is disposed between the first display panel and the second display panel, is supported by the support part, and defines an air gap, which is a space in which the first display panel and the second display panel can be vibrated by the sound generating actuator. The baffle part is disposed at an edge of the air gap and may have a dual sealing structure including at least one adhesive member attached to one surface of the first display panel or the second display panel and one surface of the support part, and at least one sealing part disposed outside the adhesive member.

One of the first display panel and the second display panel may have a weight member disposed thereon to make the first display panel and the second display panel have different weights, and the weight member may be symmetrically arranged around an area of the display panel at which the single sound generating actuator is disposed.

A sound generating actuator according to embodiments of the present disclosure as described above, which generates sound by directly vibrating two display panels of a double-faced display device, does not require a separate speaker and thus can reduce the thickness of the display device.

Further, the single sound generating actuator, which is fixed to a support structure of a double-faced display device and directly vibrates two display panels arranged in opposite directions to generate sound in opposite directions of the display device, can improve the localization or quality of the sound generated in the double-faced display device.

Moreover, the single sound generating actuator, which includes a single bobbin having an opening part allowing bidirectional movement of the bobbin, a plate having a through-hole formed therethrough, which enables the bobbin to move in opposite directions, and at least one magnet, can minimize the space occupied by the sound generating apparatus in the double-faced display device.

Further, in another embodiment of the present disclosure, opposite display panels of a double-faced display device are simultaneously vibrated by a single sound generating actuator to generate sound, the weight member additionally disposed on one of the opposite display panels can minimize the reduction in sound pressure due to the phase difference between sound waves generated in opposite directions.

The single sound generating actuator of the double-faced display device may comprise a lower plate having at least one through-hole, a bobbin having at least one opening part, two magnets disposed at both sides of the lower plate, a center pole protruding in at least one direction from a center of the lower plate, and coils wound around outsides of upper and lower side portions of the bobbin.

BRIEF DESCRIPTION OF THE DRAWINGS

The above and other objects, features and advantages of the present disclosure will be more apparent from the following detailed description taken in conjunction with the accompanying drawings, in which:

FIG. 2A is a plan view and FIG. 2B is a sectional view;

FIG. 4A illustrates a display device using a liquid crystal panel and FIG. 4B illustrates a display device using an organic light emitting display panel;

DETAILED DESCRIPTION OF THE EXEMPLARY EMBODIMENTS

Figure 1:
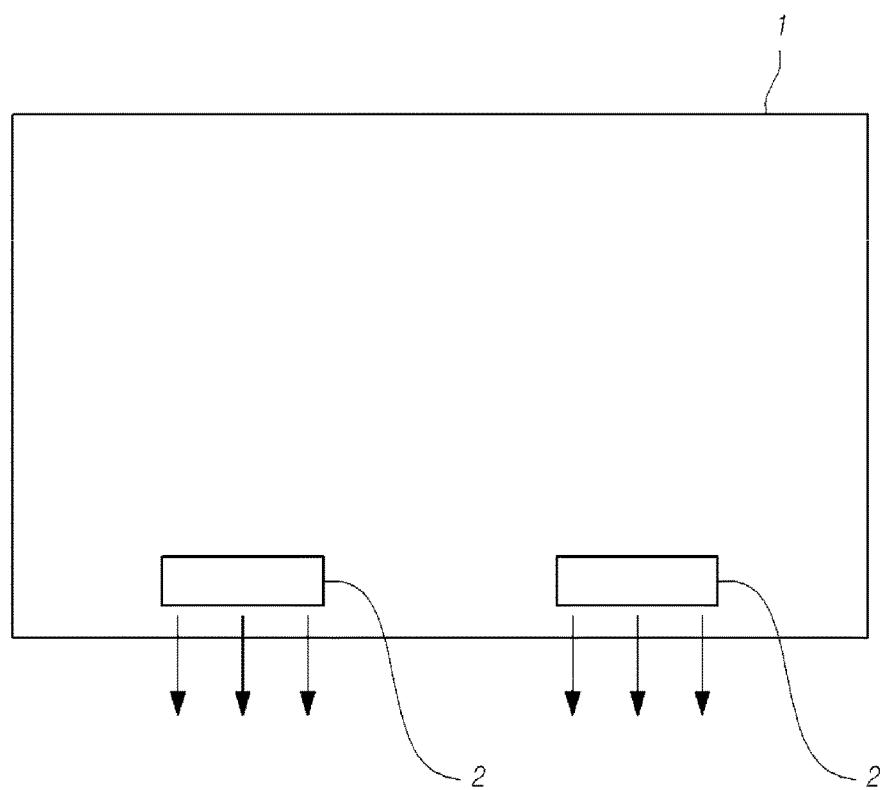
FIG. 1 is a schematic plan view of a speaker included in a conventional display device.

Hereinafter, embodiments of the present disclosure will be described with reference to the accompanying drawings.

In assigning reference numerals to elements in the drawings, the same elements will be designated by the same reference numerals as far as possible although they are illustrated in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein in describing elements of the present disclosure. Each of these terminologies is not used to define a type, order or sequence of a corresponding component but used merely to distinguish the corresponding component from other component(s). In the case that it is described that a certain element "is next to" another element, it should be understood that the certain element can be present next to or adjacent to the another element, and may or may not be in contact with the another element. In the case that it is described that a certain element "is connected to", "is coupled to", or "is connected with" another element, it should be understood that the certain element can not only be directly connected or coupled to the another element, but can also include an additional element "interposed" between the elements or the elements may be connected or coupled to each other through an additional element.

In the present specification, the term "double-faced display device" or "display device" is used not only to describe a display device, such as an OLED module or a Liquid Crystal Module (LCM) including a display panel and a driving unit for driving the display panel, but also to describe a set electronic apparatus or a set apparatus, such as a notebook computer, a television, a computer monitor, or a mobile electronic device such as a smartphone and an electronic pad, which are finished products including such an LCM or OLED module.

That is, in the present specification, a double-faced display device not only includes a display device, such as the LCM or OLED module, but also includes a set apparatus which is an applied product including the same.

For clarity, an LCM or OLED module configured by a display panel and a driving unit thereof may be expressed as a "display device", and an electronic apparatus, i.e., a finished product that includes such an LCM or OLED module may be expressed as a "set apparatus". For example, the display device may include an LCD or OLED display panel and a source PCB, which is a control unit for driving the display panel, and the set apparatus may further include a set PCB, which is a set control unit electrically connected to the source PCB to control the entire set apparatus.

The first display panel 100 and the second display panel 100' provide a double-faced display device according to an embodiment of the present disclosure, and include all types of display panels including a liquid crystal display panel, an Organic Light Emitting Diode (OLED) display panel, and a Plasma Display Panel (PDP) and is not limited to a specific display panel, as long as the display panel is directly vibrated by a single sound generating actuator 500 to generate sound wave.

Further, when the first display panel 100 and the second display panel 100' are liquid crystal display panels, each of the display panels may include a pixel defined by a plurality of gate lines, a plurality of data lines, and an intersecting area thereof; an array substrate including a thin-film transistor corresponding to a switching device for adjusting a light transmission degree at each pixel; an upper substrate including a color filter and/or a black matrix; and a liquid crystal material layer formed therebetween.

When the first display panel 100 and the second display panel 100' are OLED display panels, each of the display panel may include: a plurality of gate lines; a plurality of data lines; pixels defined at intersecting areas between the gate lines and data lines; an array substrate including a thin-film transistor, which is a switching device configured to selectively apply a voltage to each pixel; an OLED layer disposed on the array substrate; and a sealing substrate or an encapsulation substrate disposed on the array substrate to cover the OLED layer. The sealing substrate protects the thin film transistor and the OLED layer from external impact and prevents moisture from permeating the OLED layer.

Although there is no limitation in the type of the first display panel 100 and the second display panel 100' used in a double-faced display device according to various embodiments of the present disclosure, preferably, the display panel is an organic light emitting display panel for the reasons described below.

A liquid crystal display panel has many laminated layers and requires an indirect light source type back-light having a separate light source disposed therein. Therefore, when the liquid crystal display panel is directly vibrated by the sound generating actuator 200, the directivity of the liquid crystal material may be shaken, causing distortion of an image.

In contrast, since the OLED device of the OLED display panel is an emissive element, the OLED display panel does not require a separate light source and has one panel in which multiple layers including a polarization layer, a glass layer, and an encapsulation layer are integrated. Therefore, even when the OLED display panel is directly vibrated by the sound generating actuator 500, the vibration has almost no influence on the light emitting property of the organic light emitting layer and thus causes no image distortion. Therefore, the present embodiment discusses use of an OLED display panel.

The first display panel 100 and the second display panel 100' used in the double-faced display device according to an embodiment of the present disclosure has a general structure, and a more specific description thereof will be omitted.

Figure 2A:
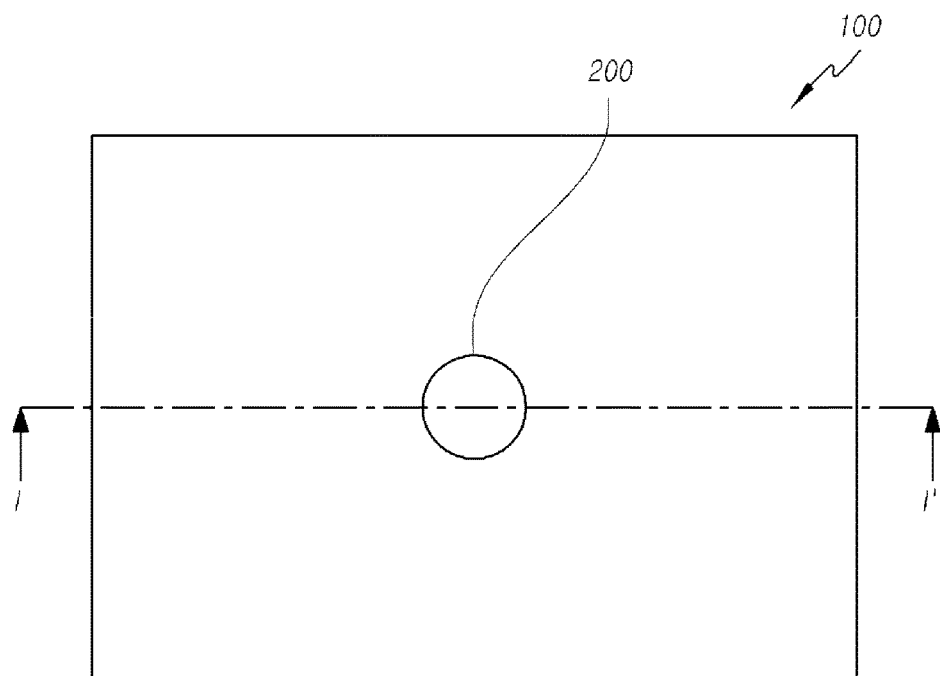
FIGS. 2A and 2B are schematic views of a unidirectional display device including a panel vibration type sound generating apparatus according to the present embodiment, where
Figure 2B:
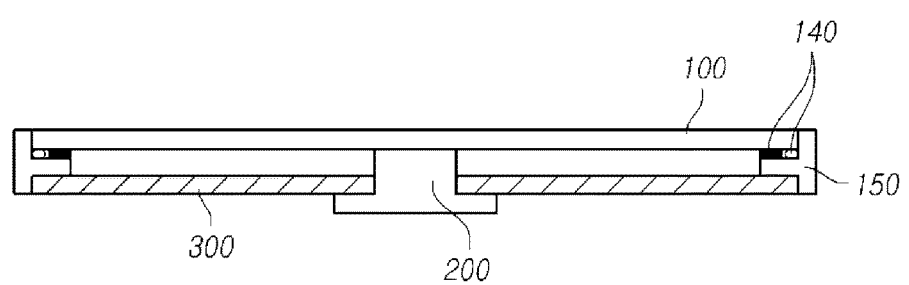

FIGS. 2A and 2B are schematic views of a unidirectional display device including a panel vibration type sound generating apparatus according to an embodiment of the present disclosure, where FIG. 2A is a plan view and FIG. 2B is a sectional view.

As shown in FIGS. 2A and 2B, a unidirectional display device including a panel vibration type sound generating apparatus according to this embodiment includes a display panel 100 configured to display an image, and a sound generating actuator 200 which is attached to a surface of the display panel and vibrates the display panel to generate sound.

The sound generating actuator 200, which is described below in more detail with reference to FIGS. 3A and 3B, used in such a unidirectional display device includes a magnet, a plate supporting the magnet, a center pole protruding from a central area of the plate, and a bobbin disposed to surround the center pole and having a coil wound thereon, to which an electric current for generating sound is applied, wherein a distal end of the bobbin is attached to one surface of the display panel.

As shown in FIG. 2B, the unidirectional display device may include a support structure configured to support one or more of the rear surface or a side surface of the display panel, and the plate of the sound generating actuator may be fixed to the support structure.

The support structure includes a cover bottom 300 disposed at the rear surface of the display panel, and may further include a middle cabinet 150 which is coupled to the cover bottom while surrounding the side surface of the display panel and receives and supports one side edge of the display panel.

The cover bottom of the support structure may be a plate-shaped member made of metal or plastic extending over the entire rear surface of the unidirectional display device.

As shown in FIGS. 2A and 2B, when sound is generated by directly vibrating a display panel of a display device, a space for confining the generated sound wave in a predetermined space is necessary. To this end, the display device may further include a baffle part 140 disposed at an edge thereof.

Figure 3A:
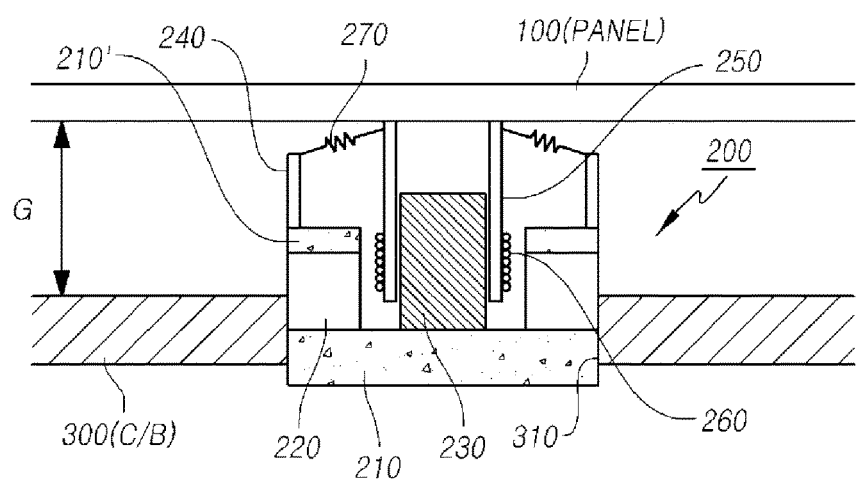
FIGS. 3A and 3B are sectional views of two types of sound generating actuators used in the unidirectional display device as shown in FIGS. 2A and 2B.
Figure 3B:
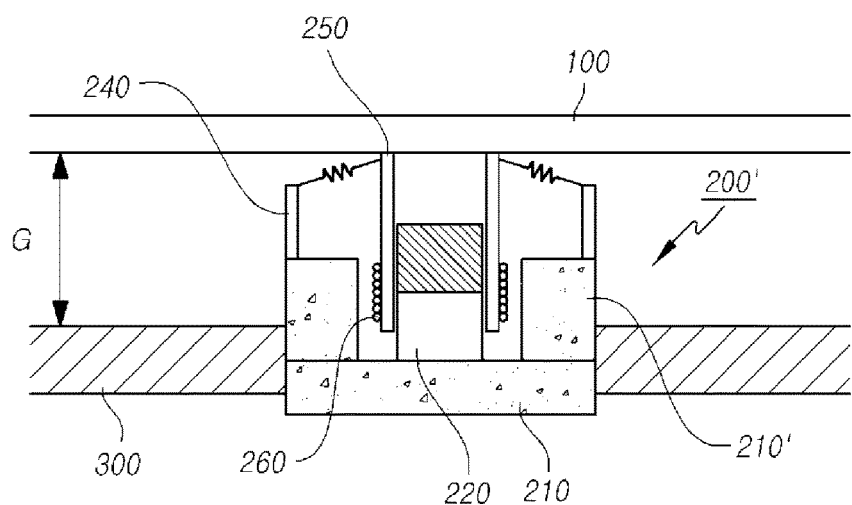

FIGS. 3A and 3B are sectional views of two types of sound generating actuators which can be used to generate sound in the unidirectional display device as shown in FIGS. 2A and 2B. The sound generating actuator 200 as shown in FIGS. 2A and 2B may include a magnet 220, which is a permanent magnet, plates 210 and 210' configured to support the magnet, a center pole 230 protruding from a central area of the plate 210, a bobbin 250 disposed to surround the center pole 230, and a coil 260 wound around the bobbin, wherein an electric current for generating sound is applied to the coil 260.

The sound generating actuator used in an embodiment of the present disclosure may include both a first structure in which the magnet is disposed outside the coil and a second structure in which the magnet is disposed inside the coil.

FIG. 3A illustrates the first structure having the magnet disposed outside the coil, which may be called a dynamic type or an external magnet type.

In the sound generating actuator of the first structure, the lower plate 210 is fixed to a support hole 310 formed at the cover bottom 300 and the magnet 220, which is a permanent magnet having a ring or an annular shape, is disposed outside the coil 260 and on the lower plate 210.

The upper plate 210' is disposed on the magnet 220, and an external frame 240 protruding from the upper plate is disposed outside the upper plate.

The center pole 230 protrudes from the central area of the lower plate 210 and the bobbin 250 surrounds the center pole 230.

The coil 260 is wound around a lower portion of the bobbin 250, and the electric current for generating sound is applied to the coil.

A damper 270 may be disposed between an upper part of the bobbin and the external frame 240.

The lower plate 210 and the upper plate 210' fix the sound generating actuator 200 to the cover bottom 300 while supporting the magnet 220, and the lower plate 210 has a cylindrical shape as shown in FIG. 3A.

As the lower plate 210 and the upper plate 210' are coupled to the cover bottom 300, the magnet 220 disposed between the lower plate 210 and the upper plate 210' can be fixedly supported.

The plate may be formed of a material having a magnetic property, such as ferrite Fe. The plate is not limited to the term thereof and may be expressed by another term, such as a yoke.

The center pole 230 and the lower plate 210 may be integrally formed.

The bobbin 250 is a cylindrical structure formed by a paper or aluminum sheet, and the coil 260 is wound around a predetermined lower area of the bobbin. This combination of the bobbin and the coil may be referred to as a voice coil.

When the electric current is applied to the coil, a magnetic field is formed around the coil. Then, due to an external magnetic field formed by the magnet 220, the entire bobbin moves upward while being guided by the center pole according to Fleming's Law.

Meanwhile, since the distal end of the bobbin 250 is attached to the rear surface of the display panel 100, the bobbin vibrates the display panel according to the application or non-application of the electric current, and such a vibration generates sound waves.

A damper 270 is disposed between an upper part of the bobbin 250 and the external frame 240, and the damper 270 has a wrinkle structure and thus contracts or expands to adjust the up-down vibration of the bobbin according to the up-down movement of the bobbin.

FIG. 3B illustrates the second structure having the magnet disposed inside the coil, which may be expressed as a micro type or an internal magnet type.

In the sound generating actuator of the second structure, the lower plate 210 is fixed to a support hole 310 formed at the cover bottom 300, the magnet 220 is disposed at a central area of the lower plate, and the center pole extends upward from the top of the magnet.

The upper plate 210' protrudes from a peripheral part of the lower plate, and the external frame 240 is disposed on the edge of the upper plate.

The bobbin 250 is disposed to surround the magnet 220 and the center pole 230, and the coil 260 is wound around the bobbin.

The damper 270 is disposed between the external frame 240 and the bobbin.

The sound generating actuator of the second structure has a smaller leakage of magnetic flux than that of the first structure having a magnet disposed outside and can have a reduced size. However, the sound generating actuator of the second structure may undergo reduction of magnetic flux due to a large current input and is difficult to manufacture.

In an embodiment of the present disclosure, both the actuators of the first structure and the second structure may be used, and the following description discusses the first structure as a representative for convenience.

The sound generating actuator used in a display device according to the present embodiment is not limited to the type illustrated in FIGS. 3A and 3B, and includes other types of actuators as long as the actuators can vibrate a display panel up and down to generate sound in response to application of an electric current.

Figure 4A:
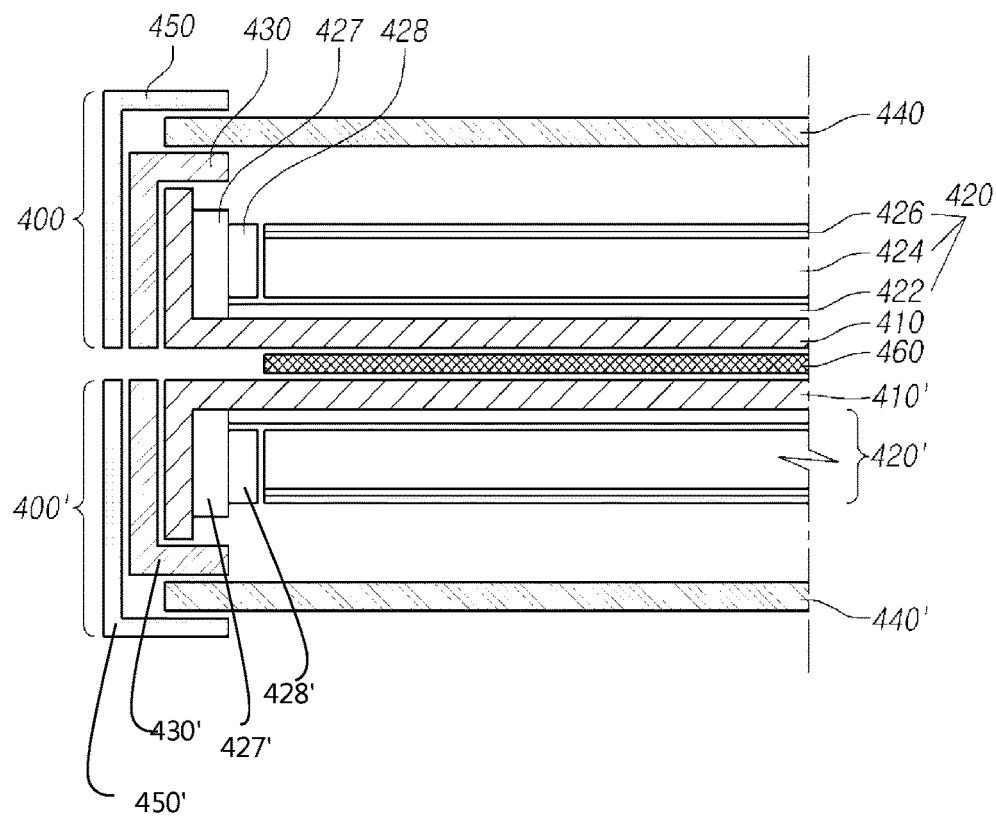
FIGS. 4A and 4B are sectional views of double-faced display devices according to an embodiment of the present disclosure, where
Figure 4B:
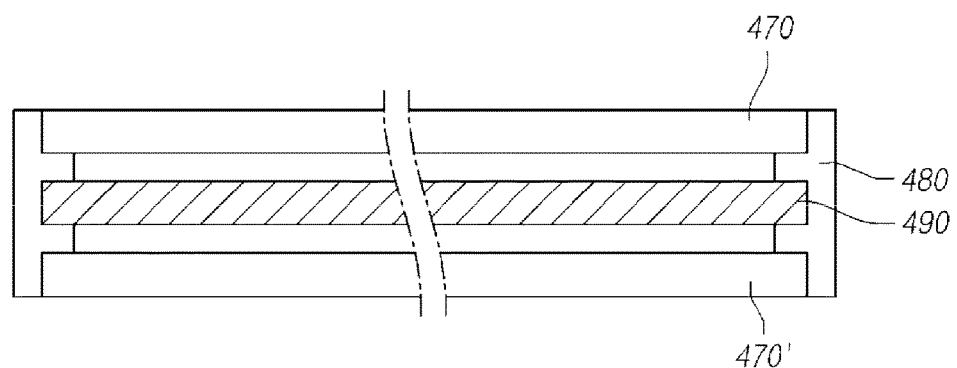

FIGS. 4A and 4B are sectional views of double-faced display devices according to an embodiment of the present disclosure wherein FIG. 4A illustrates a display device using a liquid crystal panel and FIG. 4B illustrates a display device using an organic light emitting display panel.

Each of the double-faced display devices illustrated in FIGS. 4A and 4B is a basic type of double-faced display device for outputting an image on both sides thereof and is configured by attaching two one-faced display devices to each other.

Specifically, a double-faced display device including two liquid crystal panels includes, as shown in FIG. 4A, a first display device 400 and a second display device 400' attached to each other through an adhesive member 460, such as a double-sided tape.

Each of the first display device 400 and the second display device 400' may be an independent display device, which individually operates, and includes: a liquid crystal display panel 440 or 440'; a back light unit 420 or 420' disposed thereunder to irradiate light to the display panel; and a cover bottom 410 or 410' which supports the back light unit 420 or 420', extends on the entirety of the rear surface of the display device, and is made of a metal or plastic material.

Each of the first display device 400 and the second display device 400' may further include a guide panel 430 or 430', which is fixed to a cover bottom thereof, interconnects the backlight unit 420 or 420' and the liquid crystal panel 440 or 440', and is made of plastic. The guide panel 430 or 430' has a double-sided tape attached to a part of an upper surface thereof, on which the liquid crystal display panel 440 or 440' is disposed. As a result, the display panel can be fixedly mounted.

Each of the first display device 400 and the second display device 400' includes a backlight unit 420 or 420' for providing light to the liquid crystal display panel 440 or 440', and the components thereof are similar. The backlight unit may be divided into an edge type backlight unit and a direct type backlight unit according to the arrangement of the light source and the transfer type of light.

The backlight unit shown in FIG. 4A is an edge-type backlight unit and may include: a light source module 427 including a light source 428, such as an LED, a holder configured to hold the light source, a light source driving circuit, etc.; a Light Guide Plate (LGP) 424 configured to diffuse light to the entire panel area; a reflection plate 422 configured to reflect light toward the display panel; and at least one optical film or sheet 426 disposed on the light guide plate to improve the luminance, diffuse the light, and protect the light guide plate.

FIG. 4B is a sectional view of a double-faced display device using organic light emitting display (OLED) panels, which may include two organic light emitting display panels 470 and 470' arranged on both sides of a cover bottom 490, and may further include a middle cabinet 480. The middle cabinet 480 and the cover bottom 490 are support structures for supporting the two organic light emitting display panels.

Unlike the liquid crystal display panel, each of the organic light emitting display panels 470 and 470' uses an organic light emitting material, which emits light by itself, and thus does not require a separate backlight unit.

The organic light emitting display panel may be configured by integrally laminating a substrate layer having a plurality of pixels arranged thereon, a polarization layer (POL) disposed on the substrate layer, and an encapsulation layer disposed under the substrate layer to protect the substrate layer.

The double-faced display device as illustrated in FIGS. 4A and 4B, outputs the same image or different images in opposite directions, using a separate driving circuit, and the inclusion of a sound generating apparatus associated with the image or images is further required.

In the unidirectional display device as shown in FIG. 1, various parts may be arranged on the rear surface of the display device, and a speaker for generating sound, etc. may be disposed at the bottom or rear surface of the display device.

However, unlike the conventional unidirectional display device, in the double-faced display device as shown in FIGS. 4A and 4B, the same or different images are output in opposite directions. Thus, it is difficult to arrange a speaker or speakers, because such a double-faced display device should have two speakers outputting sound in opposite directions.

To this end, a sound generating actuator configured to generate sound by directly vibrating a display panel as shown in FIGS. 2A to 3B is required for such a double-faced display device.

Figure 5A:
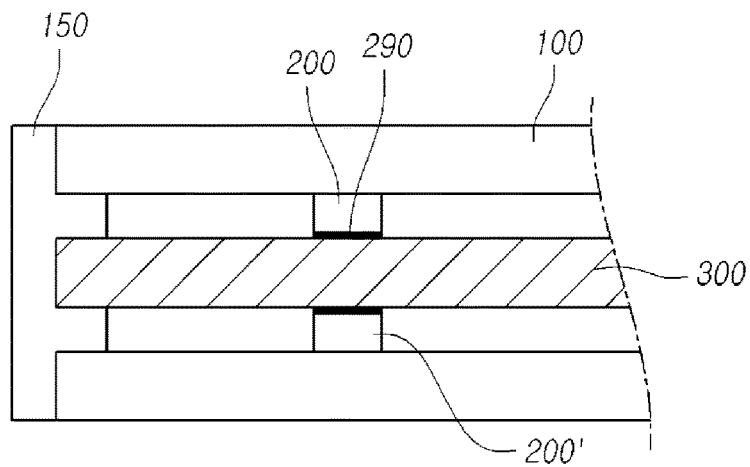
FIGS. 5A and 5B illustrate structures of panel vibration type sound generating actuators installed on a double-faced display device as shown in FIG. 4B.
Figure 5B:
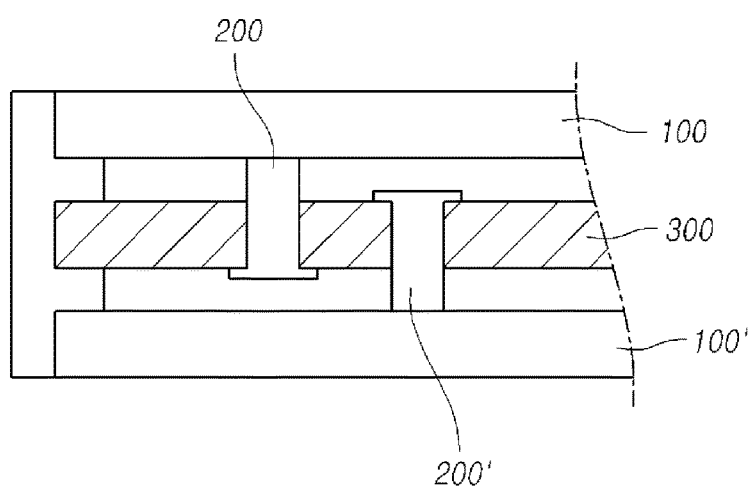

FIGS. 5A and 5B illustrate structures of panel vibration type sound generating actuators installed in a double-faced display device as shown in FIG. 4B.

In order to apply a panel vibration type sound generating actuator to a double-faced display device, the sound generating actuator is fixed to a support structure of the double-faced display device, e.g., a cover bottom. Further, the display device should have two sound generating actuators configured to vibrate two display panels, respectively, because the double-faced display device needs to output sound in both directions.

To this end, in the structure illustrated in FIG. 5A, two sound generating actuators 200 and 200' are symmetrically mounted on the opposite surfaces of the cover bottom 300, wherein adhesive members 290 are attached to the lower surfaces of the actuators.

In the structure illustrated in FIG. 5B, two support holes are formed through the cover bottom, and two sound generating actuators 200 and 200' are inserted in and fixed to the support holes.

The structures shown in FIGS. 5A and 5B require the use of two sound generating actuators, which not only increases the thickness of the double-faced display device but also requires individual installation of the two actuators to the cover bottom, which may increase the number of steps in the manufacturing process.

Therefore, an embodiment of the present disclosure proposes a single sound generating actuator, which is coupled to both of two display panels configured to display an image in opposite directions to directly vibrate the display panels and thus generate sound, and a double-faced display device including the same.

Figure 6:
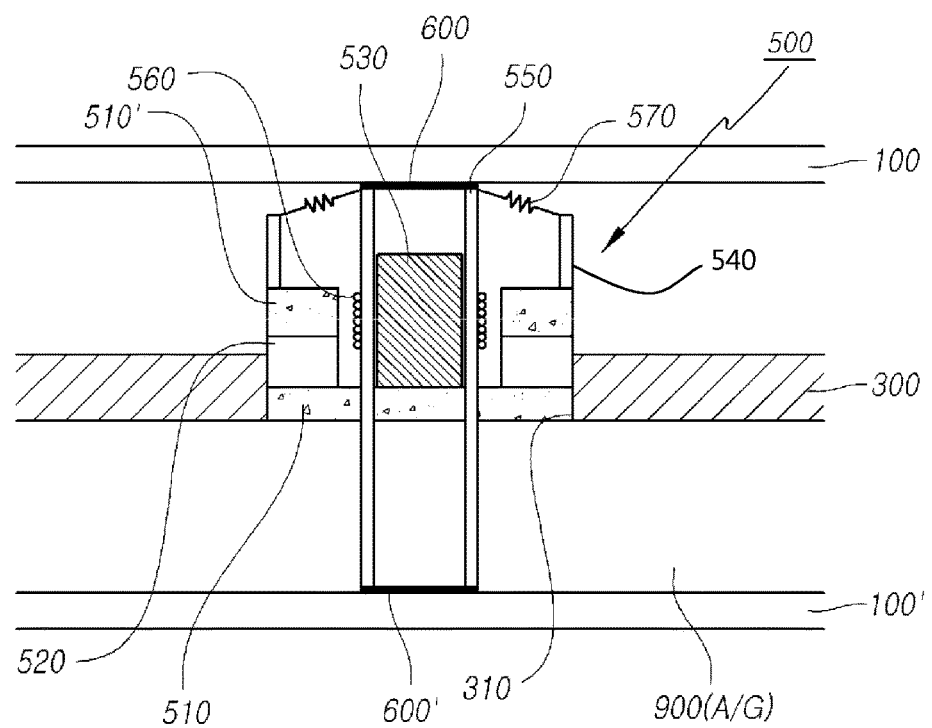
FIG. 6 is a sectional view of a double-faced display device having a single sound generating actuator mounted thereon according to an embodiment of the present disclosure.

FIG. 6 is a sectional view of a double-faced display device having a single sound generating actuator mounted therein according to an embodiment of the present disclosure.

The double-faced display device according to this embodiment includes: a first display panel 100 and a second display panel 100' disposed at the front and rear surface thereof, respectively; a single sound generating actuator 500 connected to the first display panel 100 and the second display panel 100' to simultaneously vibrate the first display panel 100 and the second display panel 100' and thus generate sound; and a support part configured to support the sound generating actuator, the first display panel, and the second display panel.

The support part may be the cover bottom 300 disposed between the first display panel and the second display panel to support the two display panels and the sound generating actuator 500, without being limited thereto.

Figure 10A:
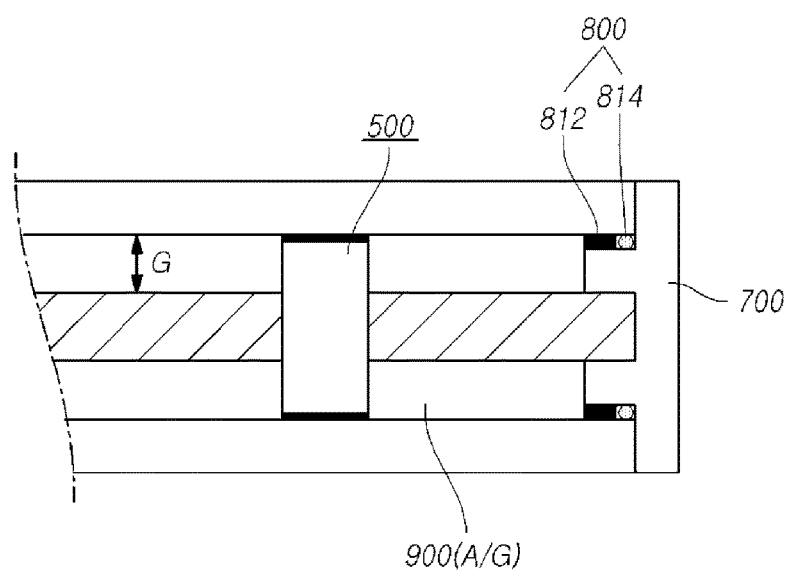
FIGS. 10A to 10C illustrate a structure of a baffle part formed between each of opposite display panels and a cover bottom, which is a support structure, in order to form a sound transferring air gap between the display panel and the cover bottom.

That is, the support part may include, in addition to the cover bottom 300, a middle cabinet 700 (as shown in FIGS. 10A to 10O) which is coupled to the cover bottom and supports one side edge of the display panel. Also, the support part may be configured to include only the middle cabinet without the cover bottom.

The cover bottom 300 in the present disclosure is not limited to the term thereof but other expressions may also be used, such as a plate bottom, a back cover, a base frame, a metal frame, a metal chassis, a chassis base, or m-chassis, and has a concept including all types of frames or plate-shaped structures, which are arranged on the rear base part of the display device as supports for supporting the display panel.

The sound generating actuator 500 is configured to be in contact with the first display panel 100 and the second display panel 100' and simultaneously vibrate the first display panel and the second display panel to generate sound, and may include a lower plate 510 having at least one through-hole, a bobbin 550 having at least one opening part, a magnet 520, which is a permanent magnet disposed on the lower plate, a center pole 530 protruding in at least one direction from the center of the lower plate, and a coil 560 wound on the outer surface of at least a part of the bobbin.

The single sound generating actuator 500 used for generation of sound in the double-faced display device may include a magnet 520, which is a permanent magnet, plates 510 and 510' configured to support the magnet, a center pole 530 protruding from a central area of the plate 210, a bobbin 550 disposed to surround the center pole 530 and having opposite ends in contact with the first display panel 100 and the second display panel 100', and a coil 560 wound on the outer surface of a part of the bobbin, wherein an electric current for generating sound is applied to the coil.

The sound generating actuator 500 used in the present embodiment may include both a first structure in which the magnet is disposed outside the coil and a second structure in which the magnet is disposed inside the coil.

The sound generating actuator illustrated in FIG. 6 has the first structure having the magnet disposed outside the coil, which may be called a dynamic type or an external magnet type.

In the sound generating actuator 500 of the first structure, the lower plate 510 is fixed to a support hole 310 formed at the cover bottom 300 and the magnet 520, which is a permanent magnet having a ring or an annular shape, is disposed outside the lower plate.

The upper plate 510' is disposed on the magnet 520, and an external frame 540 protruding from the upper plate is disposed outside the upper plate.

A center pole 530 protrudes from a central area of the lower plate 510, and a bobbin 550 having a shape of a long cylinder surrounds the center pole 530 and has opposite ends in contact with the first display panel 100 and the second display panel 100', respectively.

In contrast to the actuator described above with reference to FIGS. 2A to 3B, the sound generating actuator 500 according to this embodiment has at least one through-hole formed through the lower plate 510 to allow the bobbin 550 to vibrate in both directions with reference to the lower plate 510, and the bobbin 550 has at least one opening part 552, which are described below in more detail with reference to FIGS. 7A and 7B.

The coil 560 is wound around a side portion of the bobbin 550, and the electric current for generating sound is applied to the coil.

The magnet 520 may use a sintered magnet, such as barium ferrite, or may use a cast magnet made from an alloy of ferric oxide (Fe2O3), barium carbonate (BaCO3), strontium ferrite having an improved magnetic component, aluminum (Al), nickel (Ni), and cobalt (Co), without being limited thereto.

A damper 570 may be disposed between an upper part of the bobbin 550 and the external frame 540, and the damper 570 has a wrinkle structure and thus contracts or expands to adjust the up-down vibration of the bobbin according to the up-down movement of the bobbin. That is, since the damper 570 is connected to the bobbin 550 and to the external frame 540, the up-down vibration of the bobbin is restricted by the restoring force of the damper 570. Specifically, when the bobbin 550 vibrates upward beyond a predetermined height or downward beyond a predetermined level, the restoring force of the damper 570 can return the bobbin to its original position. The damper may be expressed by another term, such as an edge.

Figure 7A:
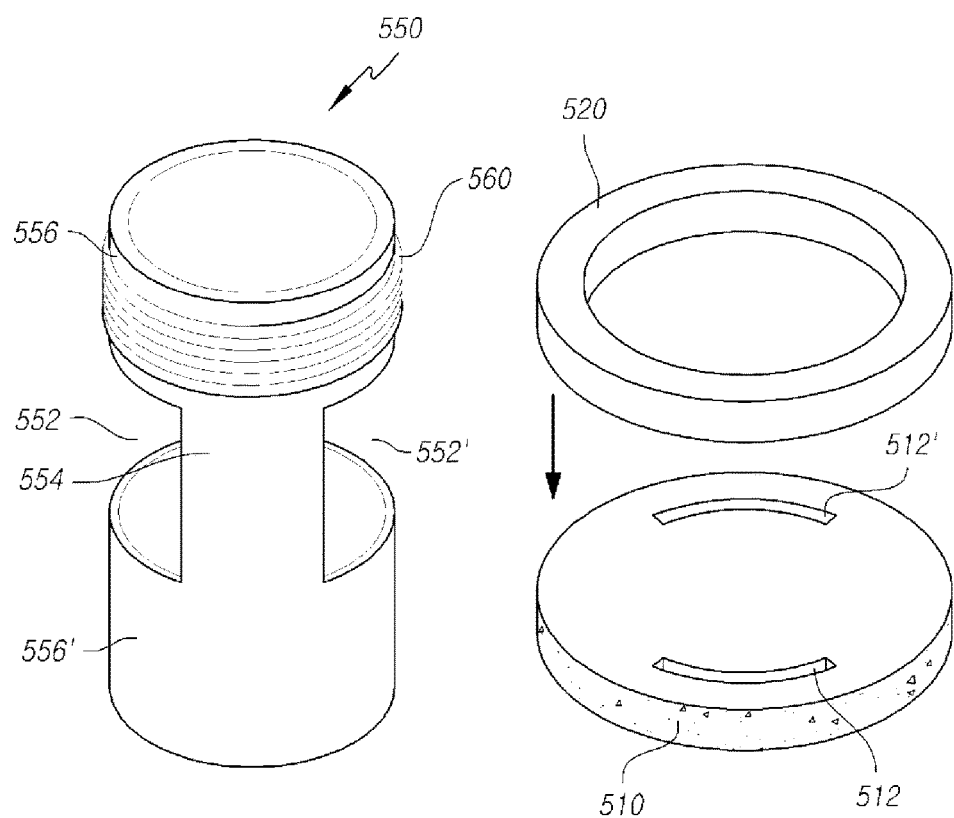
FIGS. 7A and 7B are perspective views showing in more detail a bobbin, a lower plate, and a magnet in a sound generating actuator according to an embodiment of the present disclosure.
Figure 7B:
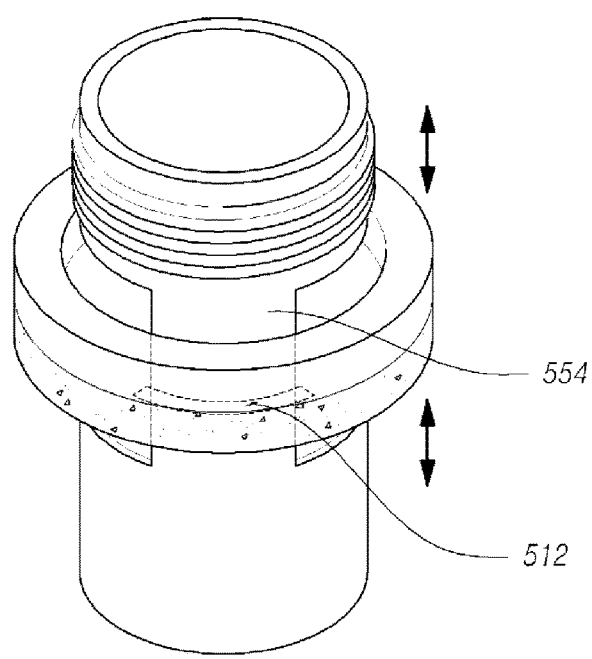

FIGS. 7A and 7B are perspective views showing in more detail a bobbin, a lower plate, and a magnet in a sound generating actuator according to an embodiment of the present disclosure.

The lower plate 510 is configured to support the magnet 520 while fixing the sound generating actuator 500 to the cover bottom 300, and may have a shape of a circular disc as shown in FIG. 7A, and may further have an arc-shaped through-hole 512 formed therethrough to allow a part of the bobbin to pass therethrough.

A magnet 520 having a shape of a ring or an annulus is fitted around the edge of the lower plate 510, and the upper plate 510' is disposed on the magnet 520 as shown in FIG. 6.

The lower plate 510 and the upper plate 510' may be made of a material having a magnetic property, like iron (Fe). The plate is not limited to the term thereof and may be expressed by another term, such as a yoke.

The center pole 530 may also be made of a material capable of transferring the magnetic force of the magnet, like iron or metal, and the center pole and the lower plate 510 may be integrally formed.

The bobbin 550 is a cylindrical structure made of a paper or aluminum sheet, and the bobbin 550 according to this embodiment has at least one opening part 552 formed at a central area thereof.

The opening part may be formed at a central area of the bobbin to have a rectangular shape having a predetermined area. Although FIG. 7A shows two opening parts 552 and 552', the number of the opening parts is not limited to two.

The two opening parts 552 and 552' divide the bobbin into an upper bobbin part 556 and a lower bobbin part 556', and a connection part 554 connecting the upper bobbin part 556 and the lower bobbin part 556' is disposed between the two opening parts.

As shown in FIG. 7B, the connection part 554 of the bobbin is fitted through the through-hole 512 of the lower plate when the bobbin is assembled with the lower plate.

As shown in FIG. 7A, a coil 560 is wound on the outer surface of one of the upper bobbin part 556 and the lower bobbin part 556' of the bobbin. This combination of the bobbin and the coil may be referred to as a voice coil.

Adhesive members 600 and 600' as shown in FIG. 6 configured to attach the bobbin to the first display panel 100 and the second display panel 100' may be arranged on the opposite distal ends of the bobbin, and the adhesive member may be configured by a double-sided adhesive tape, and the like.

Although not illustrated, in addition to the adhesive members, at least one plate may be arranged on each distal end of the bobbin, and the plate may be integrally formed with the adhesive member. The adhesive member attaches the bobbin and the first or second display panel to each other to vibrate the display panel according to the movement of the bobbin, and the plate transfers the vibrational force according to the movement of the bobbin to the display panel.

The plate may be made of plastic or metal. In order to dissipate the heat generated in the bobbin and the sound generating actuator, the plate may be made of a metallic material.

When the electric current is applied to the coil 560, a magnetic field is formed around the coil. Then, due to an external magnetic field formed by the magnet 520, the entire bobbin moves upward while being guided by the center pole according to Fleming's Law.

Meanwhile, since the opposite distal ends of the bobbin 550 are attached to the rear surfaces of the first display panel 100 and the second display panel 100', the bobbin vibrates the display panel according to the application or non-application of the electric current, and such a vibration generates sound waves.

A damper 570 is disposed between an upper part of the bobbin 550 and the external frame 540, and the damper 570 has a wrinkle structure and thus contracts or expands to adjust the up-down vibration of the bobbin according to the up-down movement of the bobbin.

For assembling the bobbin and the lower plate, the upper bobbin part 556 and the lower bobbin part 556' may be first separately manufactured, the connection part 554 integrally formed with the upper bobbin part or the lower bobbin part may be inserted through the through-hole 512 of the lower plate, and the upper bobbin part or the lower bobbin part may be then coupled to each other.

Figure 8A:
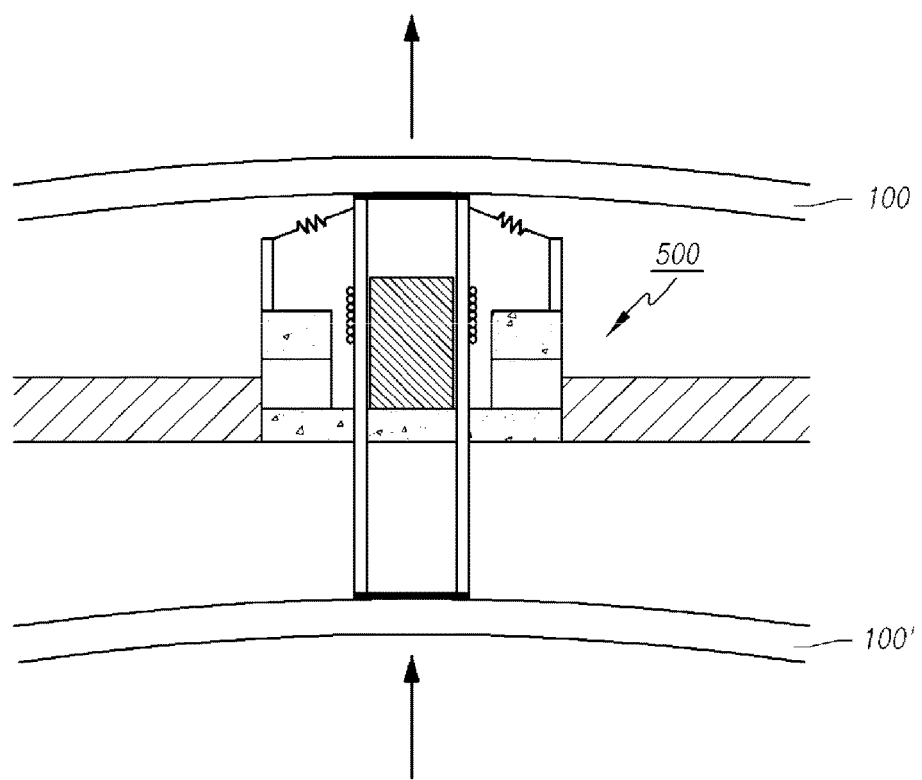
FIGS. 8A and 8B illustrate the principle in which sound is output in opposite directions by a sound generating actuator according to an embodiment of the present disclosure.
Figure 8B:
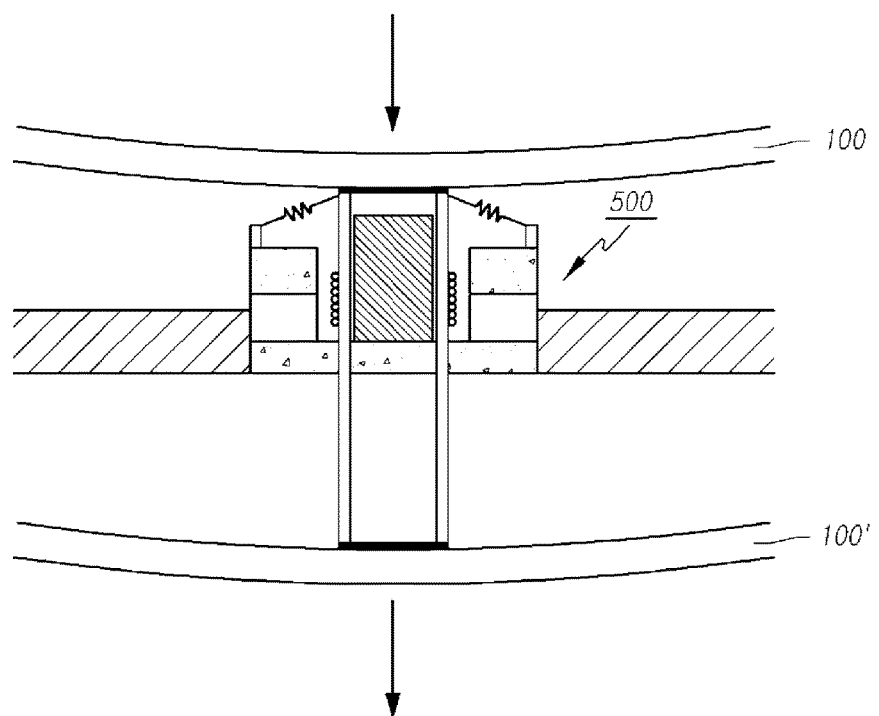

FIGS. 8A and 8B illustrate the principle in which sound is output in opposite directions by a sound generating actuator according to an embodiment of the present disclosure.

FIG. 8A illustrates a state in which the electric current has been applied, wherein the center pole magnetically connected to the lower surface of the magnet serves as the N pole and the upper plate connected to the upper surfaces of the magnet serves as the S pole to establish an external magnetic field between coils. That is, a predetermined magnetic field is established between the upper plate at the outside of the coil and the center pole at the center of the coil.

In this state, if an electric current for generating sound is applied to a coil, an applied magnetic field is generated around the coil. The applied magnetic field generates, together with the external magnetic field established between the upper plate and the center pole as described above, a force by which the bobbin is moved upward.

Then, as shown in FIG. 8A, the first display panel in contact with the upper end of the bobbin and the second display panel in contact with the lower end of the bobbin accordingly move upward.

In this state, if the application of the electric current is interrupted or the electric current is applied in the opposite direction, a force for moving the bobbin downward is generated by the same principle, and display panels of opposite sides thus move downward, as shown in FIG. 8B.

In this way, according to the direction and magnitude of the electric current applied to the coil, the bobbin vibrates up and down, and the first display panel and the second display panel attached to the opposite ends of the bobbin thus vibrate up and down to generate sound waves in opposite directions.

In this process, the connection part of the bobbin is guided through the through-hole of the lower plate to allow the bobbin to move up and down.

Figure 9A:
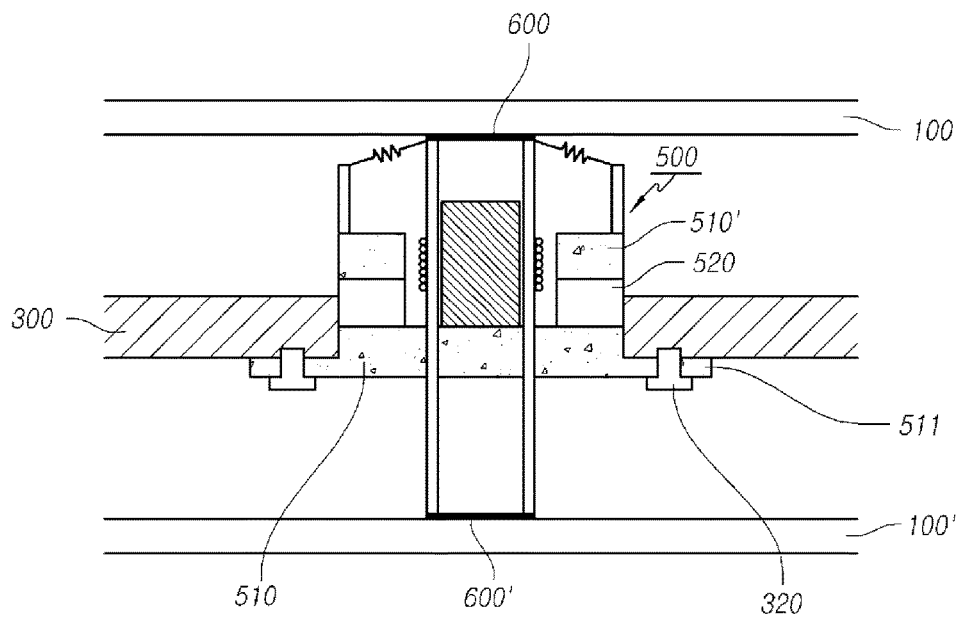
FIGS. 9A and 9B illustrate various structures for installing a sound generating actuator according to according to various embodiments of the present disclosure to a support structure of a double-faced display device.
Figure 9B:
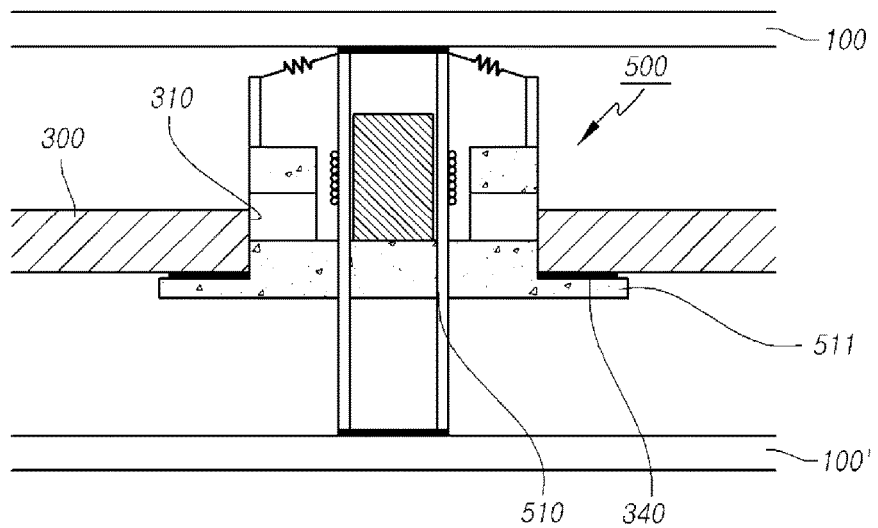

FIGS. 9A and 9B illustrate various structures for installing a sound generating actuator according to an embodiment of the present disclosure to a support structure of a double-faced display device.

The sound generating actuator 500 may be inserted through and supported by a support hole 310 formed through the cover bottom 300 or back cover, which is a support part of the double-faced display device. FIGS. 9A and 9B illustrate various coupling states.

The support hole 310 is formed through the cover bottom 300 of the double-faced display device, and at least one of the lower plate 510 of the sound generating actuator 500, the magnet 520, and the upper plate 510' is inserted and received in the support hole.

In order to fix the sound generating actuator 500 to the cover bottom, at least one of the lower plate 510, the magnet 520, and the upper plate 510' of the sound generating actuator 500 may be inserted in the support hole 310 of the cover bottom by force.

Further, an adhesive resin may be applied on a side surface of the at least one of the lower plate 510, the magnet 520, and the upper plate 510' of the sound generating actuator 500, which may then be fixed to the inner surface of the support hole 310 of the cover bottom 300.

According to another coupling method, as shown in FIG. 9A, an extension part 511 extending outward from the lower plate is additionally formed on a portion of the lower plate 510, and the extension part 511 is fixed to the lower surface of the cover bottom 300 to allow the sound generating actuator 500 to be mounted to the cover bottom.

In fixing the sound generating actuator 500 to the cover bottom 300, as shown in FIG. 9A, a screw hole is formed on the rear surface of the cover bottom, and a bolt 320 or a screw is fastened through the screw hole formed through the extension part 511 of the lower plate to the screw hole of the cover bottom to fix the sound generating actuator to the cover bottom.

In the structure shown in FIG. 9B, an adhesive member 340, such as a double-sided tape, is disposed between the cover bottom and the extension part 511 of the lower plate of the actuator to attach and fix them to each other.

When the adhesive member 340 as shown in FIG. 9B has a properly adjusted elasticity and thickness, the adhesive member can function as a kind of damper to minimize the transfer of the vibration from the actuator to the cover bottom.

The structure as shown in FIGS. 9A and 9B in which the sound generating actuator 500, which is attached to the organic light emitting display panel to directly vibrate the organic light emitting display panel, is inserted in and fixed to a support hole formed through the cover bottom, and has a reduced thickness in comparison with the structure in which the actuator is completely received in the double-faced display device.

That is, when the sound generating actuator 500 is inserted in and fixed to the support hole formed through the cover bottom, the distance between the display panel and the cover bottom can be reduced to thereby reduce the thickness of the display device.

Although an air gap as a space in which the display panel can vibrate is arranged between the display panel and the cover bottom, the sound generating actuator inserted in/fixed to the support hole of the cover bottom can minimize the air gap due to the reduced height of the sound generating actuator disposed between the rear surface of the display panel and the inner surface of the cover bottom.

Figure 10B:
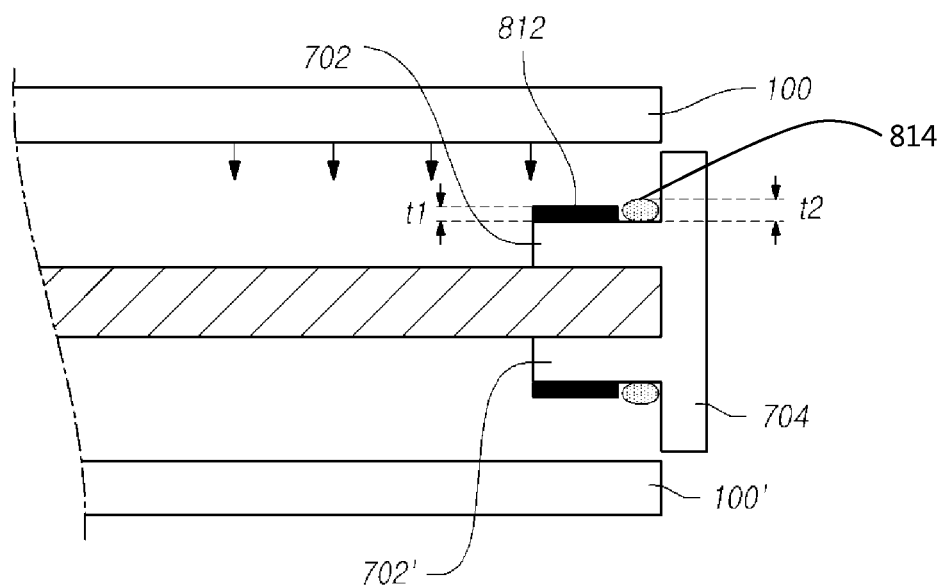
Figure 10C:
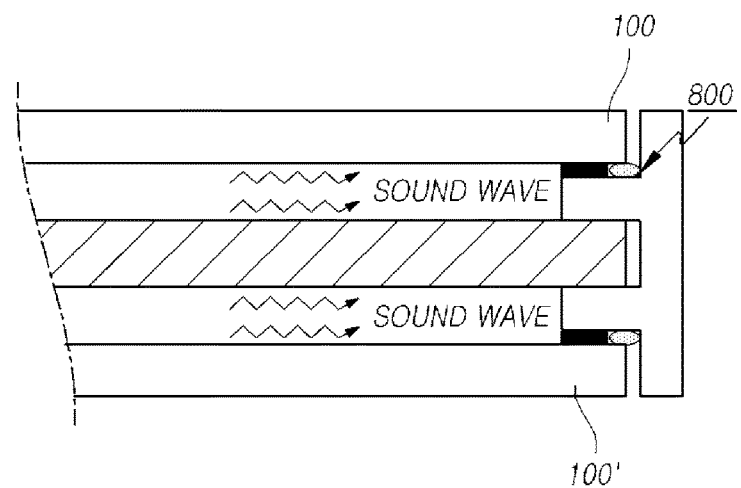

FIGS. 10A to 10C illustrate an example of a baffle part formed between each of opposite display panels and a middle cabinet, which is one of structures for supporting the display panels, to form a sound transferring air gap between the display panel, which serves as a vibrating plate, and a cover bottom.

As shown in FIG. 6, the panel vibration type sound generating apparatus according to an embodiment of the present disclosure should secure an air gap 900, which is a space allowing the panel to be vibrated by the sound generating apparatus 500, between the display panel 100 and a support structure (cover bottom 300).

Further, one side of each of the opposite display panels are coupled to the support structure of the display panel to generate sound waves during the vibration of the display panel. Especially, the sound waves thus generated should not leak to the outside through a side, and the like, of the display device.

To this end, the display device according to an embodiment of the present disclosure has a baffle part 800 formed between the support structure and the lower surface of each of the first display panel and the second display panel.

Specifically, a predetermined section (that is, air gap) may be defined around the sound generating actuator, and a baffle part 800 may be disposed between the upper surface of the cover bottom or middle cabinet and the lower surface of the first display panel or the second display panel at an edge of the section. The baffle part 800 may include an adhesive member 812, such as a double-sided tape, attached between the lower surface of the first display panel or the second display panel and the upper surface of the support structure of the display device, and a sealing part 814 disposed outside the adhesive member.

The section in which the baffle part is formed may be the entire display panel area defined by four outer sides of the first or second display panel. However, the section is not limited to such a definition and may be defined by an area excluding the area in which a source PCB is disposed or an area occupying a part of the first or second display panel, as described below.

When two or more sound generating actuators are arranged to implement stereo or three-dimensional sound, two or more sections may be separately arranged to form the baffle part.

As shown in FIG. 10A, the support structure of the display device may include a middle cabinet 700, which is coupled to the cover bottom and is configured to allow a part of the display panel to be stably placed thereon, in addition to the cover bottom 300 covering the entire rear surfaces of the first and second display panels.

As shown in FIG. 10B, the middle cabinet 700 is a frame-shaped member formed along the outer periphery or edge of the display panel, and includes horizontal support parts 702 on which parts of the first and second display panels are stably placed, and a vertical support part 704 bent perpendicularly in opposite directions from the horizontal support parts to cover the side surface of the cover bottom and the side surface of the display panel.

The middle cabinet 700 provides an external ornamental part of the side surface of the display device or set apparatus, and may not be used or integrally formed with the cover bottom in some cases.

According to the embodiment of FIGS. 10A to 10C, the adhesive member 812 of the baffle part 800 is a double-sided tape disposed between the upper surface of the horizontal support part of the middle cabinet 700 and the first display panel or the second display panel and fixes the lower surface of the first display panel or the second display panel to the middle cabinet.

The sealing part 814 of the baffle part is placed outside of the adhesive member and preferably has a thickness or height larger than the thickness or height of the adhesive member.

The sealing member 814 may be made from a material having a large elasticity, such as rubber, and has a thickness t2 larger than the thickness t1 of the adhesive member 812, as illustrated in FIG. 10B.

That is, as illustrated in FIG. 10B, one adhesive surface of the adhesive member 812, which is a double-sided tape having a thickness t1, is attached to the inner part of the upper surface of the horizontal support part 702 of the middle cabinet 700, and the sealing part 814 made of an elastic material having a thickness larger than t1 is disposed outside the adhesive member.

In this state, the first display panel 100 and the second display panel 100' are attached to the other adhesive surface of the adhesive member 812. Then, the display panels are attached to the middle cabinet while pressing, to a certain degree, the sealing part 814 having the larger thickness. (FIG. 10b)

As a result, the sealing of the air gap 900 around the sound generating actuator is further enhanced.

The structure illustrated in FIG. 10B, the first and second display panels and the cover bottom 300 are coupled to each other while forming the air gap 900, where the air gap is as wide as the thickness of the adhesive member 812 and the horizontal support part 702 of the middle cabinet. This structure can, thus, secure a vibration space in which the display panel can generate sound, and can prevent the internally generated sound waves from leaking to the outside along the side surface of the display device.

The baffle part 800 disposed at an edge of the air gap, which has a double structure of the adhesive member 812 and the sealing part 814 while allowing the sealing part to have a larger thickness, can further enhance the sealing of the air gap and prevent leakage of the sound.

It should be construed that the middle cabinet 700 used in the present specification may be replaced by another term, such as a guide panel, a plastic chassis, a p-chassis, a support main, a main support, or a mold frame, and includes all types of members, which are structures having a shape of a four-sided frame and having a sectional shape including multiple bent portions and are connected to the cover bottom to be used to support the display panel and the baffle part.

The middle cabinet 700 may be made of synthetic resin, such as a polycarbonate, or a metal material, such as aluminum, and may be manufactured by a manufacturing method, such as injection molding, without being limited thereto.

Although a middle cabinet is used to support the cover bottom and the display panel in the embodiment described above, the middle cabinet may not always be present.

Therefore, in some cases, the panel may have a structure in which the cover bottom 300 supports both the first display panel and the second display panel while forming an external lateral appearance of the display device without the middle cabinet. In such a structure, the baffle part 800 may be disposed between a part of the edge of the cover bottom and the first display panel and between the part and the second display panel.

When the middle cabinet does not exist, the cover bottom may have a stepped portion formed at an edge thereof and an adhesive member 812 and a sealing part 814 arranged on the upper surface of the stepped portion.

This embodiment has a simple structure without a middle support structure and includes the baffle part 800, which is disposed at an edge of the air gap and has a double structure of the adhesive member 812 and the sealing part 814 while allowing the sealing part to have a larger thickness, and therefore, can secure a vibration space in which the display panel can generate sound, and can prevent the internally generated sound waves from leaking to the outside along the side surface of the display device.

The thickness of the air gap 900, that is, the distance G between the first or second display panel and the cover bottom, shown in FIG. 10A, may have a value of about 1.0 to 3.0 mm in an embodiment of the present disclosure. However, the thickness is not limited to this range and may have a value in a different range according to the degree of vibration of the display panel, and the like.

However, in order to reduce the thickness of the double-faced display device, it is preferable to minimize the thickness G of the air gap taking into consideration the quantity of vibration of the display panel by the sound generating actuator, the range of sound to be output, and the quantity of output. In an embodiment of the present disclosure, an optimum thickness G of the air gap is about 2.0 mm.

Figure 11:
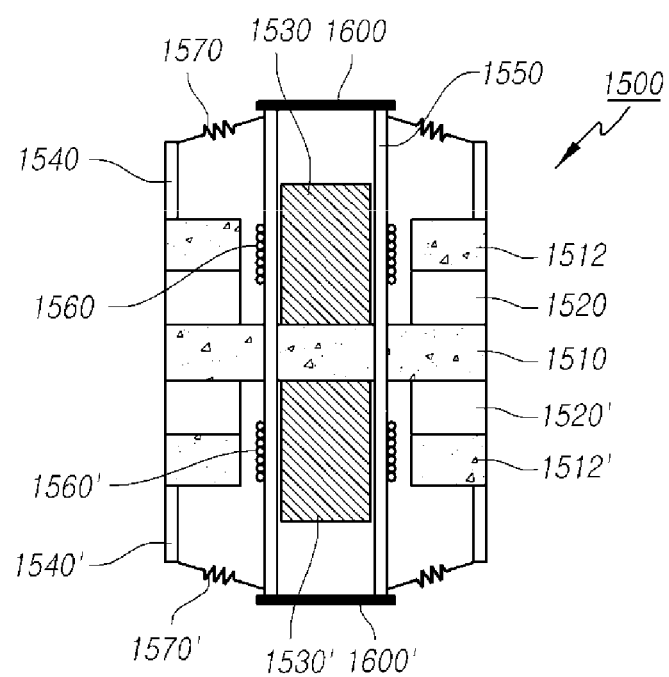
FIG. 11 is a sectional view illustrating a structure of a sound generating actuator according to another embodiment of the present disclosure.

FIG. 11 is a sectional view illustrating a structure of a sound generating actuator according to another embodiment of the present disclosure.

The embodiment of FIG. 11 presents a sound generating actuator 1500 having symmetrical upper and lower parts with reference to a lower plate thereof.

That is, a first magnet 1520, a first upper plate 1512, a first center pole 1530, a first external frame 1540, and a first damper 1570 are arranged above the lower plate 1510, and a second magnet 1520', a second upper plate 1512', a second center pole 1530', a second external frame 1540', and a second damper 1570' are arranged under the lower plate 1510.

The bobbin is disposed to extend through both the upper part and the lower part, and a first coil 1560 and a second coil 1560' are wound around the upper part and the lower part of the bobbin, respectively.

In the sound generating actuator of FIG. 11, as illustrated in FIGS. 7A and 7B, a through-hole is formed through the lower plate 1510, the bobbin 1550 has a opening part and a connection part, and the connection part of the bobbin is inserted through the through-hole of the lower plate when the bobbin is assembled with the lower plate.

In the sound generating actuator of FIG. 11, electric current is applied to both the first coil and the second coil to generate a force to move the bobbin in both the upper part and the lower part. Therefore, the actuator of FIG. 11 can generate a larger vibration than the actuator illustrated in FIG. 6. Therefore, use of the embodiment illustrated in FIG. 11 can yield a larger sound output by the same electric current.

Figure 12:
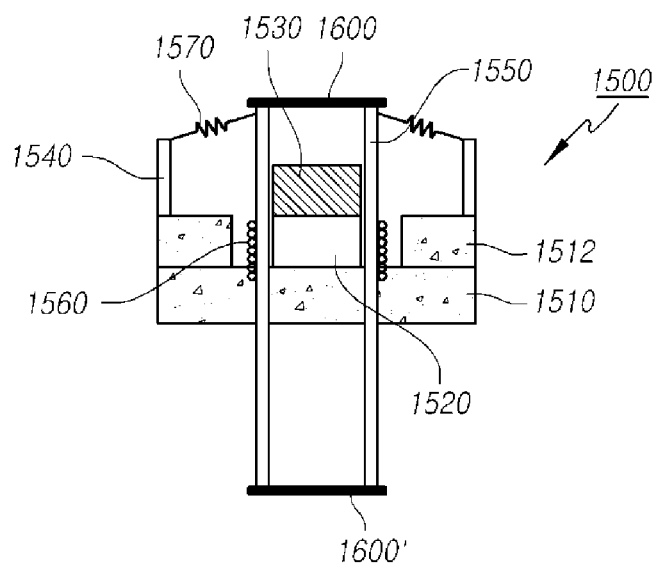
FIG. 12 illustrates a structure of a sound generating actuator according to another embodiment of the present disclosure.

FIG. 12 illustrates a structure of a sound generating actuator according to another embodiment of the present disclosure.

Although FIGS. 6 to 11 discuss the external magnet type or dynamic type actuator having a magnet disposed outside of a bobbin, the present disclosure is not limited thereto and may be implemented by an internal magnet type or micro type actuator as illustrated in FIG. 12.

In the internal magnet type sound generating actuator 1500 as shown in FIG. 12, the lower plate 1510 is fixed to a support hole 310 formed at the cover bottom 300, the magnet 1520 is disposed at a central area of the lower plate, and the center pole 1530 extends upward from the top of the magnet.

The upper plate 1512 protrudes from a peripheral part of the lower plate, and the external frame 1540 is disposed on the edge of the upper plate.

The bobbin 1550 is disposed to surround the magnet 1520 and the center pole 1530, and the coil 1560 is wound around the bobbin.

The damper 1570 is disposed between the external frame 1540 and the bobbin.

The internal magnet type sound generating actuator has a smaller leakage of magnetic flux than that of the external magnet type actuator and can have a reduced size. However, the sound generating actuator of the second structure may undergo reduction of magnetic flux due to heating of a Neodymium (Nd) magnet, and is somewhat difficult to manufacture.

In the internal magnet type sound generating actuator of FIG. 12, as illustrated in FIGS. 7A and 7B, a through-hole is formed through the lower plate 1510, the bobbin 1550 has a opening part and a connection part, and the connection part of the bobbin is inserted through the through-hole of the lower plate when the bobbin is assembled with the lower plate.

Further, the opposite distal ends of the bobbin 1550 are attached to the first display panel and the second display panel. To this end, an adhesive member, such as a double-sided tape, may be attached between the opposite distal ends of the bobbin and the surfaces of the display panels.

Figure 13:
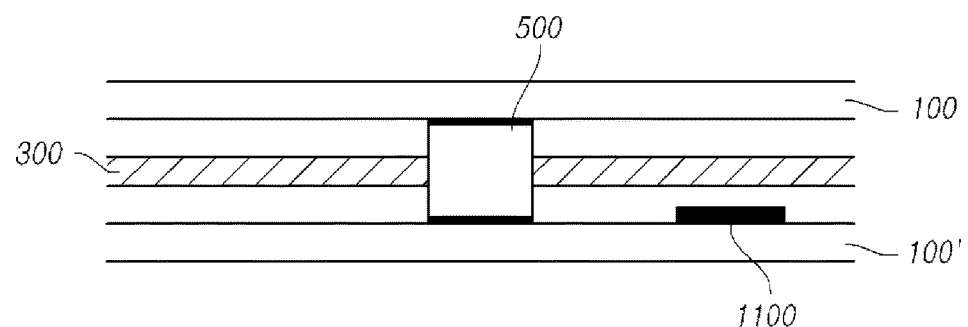
FIG. 13 illustrates a structure in which a weight member is additionally attached to one of the opposite display panels in order to minimize reduction in the sound pressure because of the phase difference of the sound waves generated in opposite directions.

FIG. 13 illustrates a structure in which a weight member is additionally attached to one of the opposite display panels in order to minimize the sound pressure reduction of the sound of the opposite directions.

In the sound generating actuator according to this embodiment, a single bobbin 500 simultaneously vibrates the first display panel 100 and the second display panel 100' to generate sound. However, the vibration directions of the first display panel 100 and the second display panel 100' may be opposite to each other, and the sound generated by the first display panel 100 and the second display panel 100' may have opposite phases.

In other words, when the bobbin moves upward, the first display panel 100 moves outward from the air gap while the second display panel 100' moves inward to the air gap. In contrast, when the bobbin moves downward, the first display panel 100 moves inward to the air gap while the second display panel 100' moves outward from the air gap.

As a result, the sound generated from the opposite sides of the double-faced display device may have opposite phases.

Low frequency band sound has a weak straightness in comparison with high frequency band sound and can spread to the surroundings. Especially, since the sound output in opposite directions has different phases, the low frequency band sounds output in opposite directions may interfere with each other to reduce the sound pressure.

This problematic phenomenon may occur when the first display panel and the second display panel disposed as opposite sides of the double-faced display device have the same structure and weight, and is a phenomenon generated because sound waves generated in opposite directions by a single sound generating actuator have nearly the same frequency characteristics, differing only in the phases thereof.

In the embodiment of FIG. 13, a weight member is additionally disposed on one of the first display panel and the second display panel in order to minimize the sound pressure reduction caused by sounds having the same frequency characteristics, which differ only in the phases thereof.

As illustrated in FIG. 13, a weight member 1100 having a predetermined weight may be disposed on a part of the inner surface of the second display panel 100'.

Due to the weight member 1100, the first display panel 100 and the second display panel 100' may have different weights and may thus cause sound waves generated by opposite panels vibrated by a single sound generating actuator to have different frequency characteristics.

Therefore, the weight member can minimize the sound pressure reduction even when the sound waves generated in opposite directions interfere with each other, and can especially prevent the sound pressure reduction of the low frequency band sound.

The weight member 1100 may have a shape of a plate or disc having a predetermined thickness. However, the weight member is not limited thereto and may include all types of members which have a predetermined weight and can be attached to one of the first display panel 100 and the second display panel 100'.

Figure 14A:
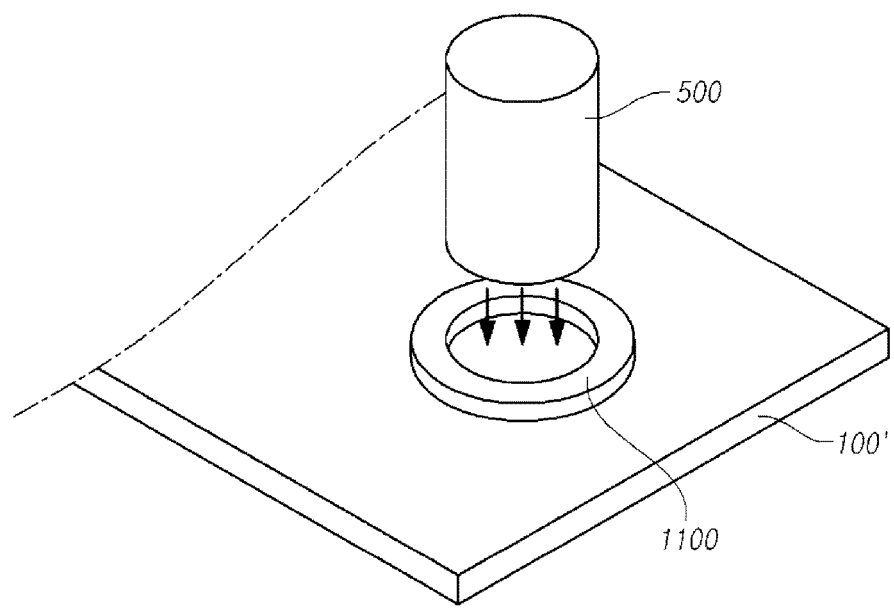
FIGS. 14A and 14B illustrate an example of a weight member mounted to one of opposite panels of a double-faced display device according to an embodiment of the present disclosure.
Figure 14B:
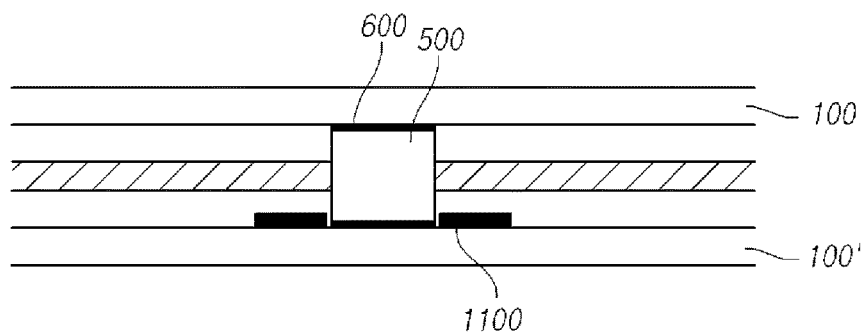

FIGS. 14A and 14B illustrate an example of a weight member mounted to one of opposite panels of a double-faced display device according to the present embodiment.

As shown in FIGS. 14A and 14B, the weight member 1100 attached to one of the opposite panels of a double-faced display device may be symmetrically disposed around the area to which the sound generating actuator is attached.

As illustrated in FIGS. 14A and 14B, the weight member 1100 may have a shape of an annular plate having a predetermined thickness, and the bobbin of the sound generating actuator may extend through a central hole of the weight member 1100 to be in contact with a display panel at the distal end of the bobbin.

As a result, the weight member 1100 is symmetrically disposed around the sound generating actuator, so as to prevent the second display panel 100' from being asymmetrically vibrated by the sound generating actuator due to the weight member.

If the weight member is disposed at only one side of the sound generating actuator, the area having the weight member located therein and the area having no weight member therein have different vibration characteristics, which may cause distortion of sound.

The symmetric arrangement of the weight member around the sound generating actuator as shown in FIGS. 14A and 14B can minimize the asymmetry of vibration by the weight member and resulting sound distortion.

A sound generating actuator according to embodiments of the present disclosure as described above, which generates sound by directly vibrating two display panels provided in a double-faced display device, does not require a separate speaker and thus can reduce the thickness of the display device.

Further, the single sound generating actuator, which is fixed to a support structure of a double-faced display device and directly vibrates two display panels arranged in opposite directions to generate sound in opposite directions of the display device, can improve the localization or quality of sound in the double-faced display device.

Moreover, the single sound generating actuator, which includes a single bobbin having a connection part and a opening part allowing bidirectional movement of the bobbin, a lower plate having a through-hole formed therethrough, which guides the bobbin and enables the bobbin to move in opposite directions, and at least one magnet, can minimize the space occupied by the sound generating apparatus in the double-faced display device.

Further, in the structure where opposite display panels of a double-faced display device are simultaneously vibrated by a single sound generating actuator to generate sound, a weight member additionally disposed on one of the opposite display panels can minimize the sound pressure reduction due to a phase difference between the sound waves generated in opposite directions.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A double-faced display device comprising:
a first display panel and a second display panel providing a front surface and a rear surface of the display device, respectively;
a sound generating actuator connected to the first display panel and the second display panel to simultaneously vibrate the first display panel and the second display panel to generate sound waves; and
a support part configured to support the sound generating actuator, the first display panel, and the second display panel,
wherein the first display panel is configured to be vibrated by the sound generating actuator to generate sound waves with different frequency characteristics from sound waves being generated by the second display panel,
wherein the sound generating actuator comprises:
a bobbin having at least one opening part;
a plate having at least one through-hole;
a magnet disposed on the plate;
a center pole located at a center of the lower plate; and
a coil wound around an outside of a portion of the bobbin, and
wherein the bobbin further comprises at least one connection part connecting an upper part and a lower part of the bobbin and being located between the at least one opening part, the connection part being inserted through the through-hole of the plate.

2. The double-faced display device of claim 1, further comprising a baffle part disposed between the first display panel and the second display panel for sealing a side of the display device, the baffle part defining an air gap.

3. The double-faced display device of claim 2, wherein the baffle part attaches the first display panel to the support part, or the second display panel to the support part.

4. The double-faced display device of claim 3 wherein the baffle part comprises a dual sealing structure including at least one adhesive member attached to one surface of the first display panel or the second display panel and one surface of the support part, and further comprises at least one sealing part disposed next to the adhesive member.

5. The double-faced display device of claim 1, wherein the support part comprises a support hole, the sound generating actuator being inserted through the support hole.

6. The double-faced display device of claim 1, wherein the support part comprises a middle cabinet located along an outer periphery of the first display panel or second display panel.

7. The double-faced display device of claim 1, wherein the magnet is disposed on the inside or on the outside of the coil.

8. The double-faced display device of claim 1, wherein the sound generating actuator comprises:
the plate having at least one through-hole, the plate having upper and lower sides;
the bobbin having at least one opening part;
two magnets located at the upper and lower sides of the plate respectively;
the center pole protruding in at least one direction from a center of the plate; and
the coils wound around an outside of at least one of the upper and lower side portions of the bobbin.

9. The double-faced display device of claim 1, wherein the sound generating actuator further comprises an adhesive member disposed on a distal end of the bobbin to attach the distal end of the bobbin to the first display panel or the second display panel.

10. The double-faced display device of claim 1, further comprising a weight member disposed on the first display panel or the second display panel, such that the first display panel and the second display panel have different weights.

11. The double-faced display device of claim 10, wherein the weight member is symmetrically arranged around an area of the first display panel or the second display panel at which the sound generating actuator is located.

12. The double-faced display device of claim 1, wherein an air gap is provided between the first display panel and the support part, and between the second display panel and the support part.

13. The double-faced display device of claim 1, wherein the sound generating actuator is configured to directly vibrate both the first display panel and the second display panel.

14. The double-faced display device of claim 1, wherein each of the first display panel and the second display panel includes a plurality of gate lines, a plurality of data lines, and a pixel at an intersecting area of the gate lines and data lines on a substrate, the pixel having a thin-film transistor.

15. A double-faced display device, comprising:
a first display panel disposed at a front surface of the display device and configured to display a first image and to be vibrated to generate sound waves;
a second display panel disposed at a rear surface of the display device and configured to display a second image and to be vibrated to generate sound waves with different frequency characteristics from the sound waves being generated by the first display panel;
a sound generating actuator connected to at least one of the first display panel and the second display panel to vibrate the at least one of the first display panel and the second display panel to generate the sound waves of the at least one of the first display panel and the second display panel; and
a support part configured to support the first display panel, the second display panel, and the sound generating actuator,
wherein the sound generating actuator comprises:
a bobbin having at least one opening part;
a plate having at least one through-hole;
a magnet disposed on the plate;
a center pole located at a center of the lower plate; and
a coil wound around an outside of a portion of the bobbin, and
wherein the bobbin further comprises at least one connection part connecting an upper part and a lower part of the bobbin and being located between the at least one opening part, the connection part being inserted through the through-hole of the plate.

16. The display device of claim 15, further comprising a weight member disposed in the first display panel or the second display panel, such that the first display panel has a different weight from the second display panel, wherein the sound generating actuator is configured to vibrate the first display panel and the second display panel simultaneously to generate the respective sound waves.

17. The display device of claim 16, wherein the weight member is symmetrically disposed around the sound generating actuator.

18. The display device of claim 15, wherein at least one of the first display panel and the second display panel includes a plurality of gate lines, a plurality of data lines, and a pixel at an intersecting area of the gate lines and data lines on a substrate, the pixel having a thin-film transistor.

* * * * *